US009991083B2

(12) United States Patent
Park et al.

(10) Patent No.: US 9,991,083 B2
(45) Date of Patent: Jun. 5, 2018

(54) MAGNETRON COOLING FIN AND MAGNETRON HAVING THE SAME

(71) Applicant: Samsung Electronics Co., Ltd., Suwon-si (KR)

(72) Inventors: Dong Ho Park, Suwon-si (KR); Hak-Jae Kim, Suwon-si (KR); Myoung Keun Kwon, Seoul (KR); Eung Ryeol Seo, Suwon-si (KR); Seung Chul Yang, Suwon-si (KR)

(73) Assignee: SAMSUNG ELECTRNOICS CO., LTD., Suwon-si (KR)

( * ) Notice: Subject to any disclaimer, the term of this patent is extended or adjusted under 35 U.S.C. 154(b) by 0 days. days.

(21) Appl. No.: 15/440,149

(22) Filed: Feb. 23, 2017

(65) Prior Publication Data

US 2017/0243711 A1 Aug. 24, 2017

(30) Foreign Application Priority Data

Feb. 23, 2016 (KR) ........................ 10-2016-0021081
Dec. 7, 2016 (KR) ........................ 10-2016-0165753

(51) Int. Cl.
*C23C 14/00* (2006.01)
*H01J 23/00* (2006.01)
*H01J 25/50* (2006.01)

(52) U.S. Cl.
CPC ............ *H01J 23/005* (2013.01); *H01J 25/50* (2013.01)

(58) Field of Classification Search
CPC .......... H01J 25/587; H01J 23/05; H01J 23/15; H01J 25/50; H01J 23/10; H01J 37/3408; H01J 37/3405; H01J 37/3452; H01J 37/3455; H01J 37/342; H01J 37/3435; H01J 37/32192; H01J 37/32229; H01J 37/32357; C23C 14/35; C23C 14/3407; C23C 14/3414; C23C 8/36; B29C 59/14
See application file for complete search history.

(56) References Cited

U.S. PATENT DOCUMENTS

| | | | | |
|---|---|---|---|---|
| 2006/0049766 A1 | 4/2006 | Lee et al. | | |
| 2010/0052501 A1* | 3/2010 | Ueda | B23K 1/0008 | 313/271 |
| 2011/0284528 A1* | 11/2011 | Kanzaki | H05B 6/642 | 219/710 |

FOREIGN PATENT DOCUMENTS

| | | |
|---|---|---|
| JP | 58-85250 | 5/1983 |
| JP | 11-219661 | 8/1999 |
| JP | 2013-206731 | 10/2013 |
| KR | 10-2001-0039265 | 5/2001 |

OTHER PUBLICATIONS

International Search Report dated Jun. 12, 2017 in International Patent Application No. PCT/KR2017/001975.

* cited by examiner

*Primary Examiner* — Minh D A
(74) *Attorney, Agent, or Firm* — Staas & Halsey LLP

(57) ABSTRACT

A magnetron cooling fin has a flat plate shape in which one or a plurality of corrugated regions are formed in a body of the magnetron cooling fin to improve cooling efficiency thereof. A magnetron cooling fin in which a corrugated region processed to increase a contact area in contact with air is formed around a through-hole through which an anode unit of a magnetron passes, thereby improving cooling efficiency thereof.

20 Claims, 26 Drawing Sheets
(4 of 26 Drawing Sheet(s) Filed in Color)

MAGNETRON COOLING FIN AND MAGNETRON HAVING THE SAME

CROSS-REFERENCE TO RELATED APPLICATIONS

This application claims the priority benefit of Korean Patent Application No. 10-2016-0021081, filed on Feb. 23, 2016 in the Korean Intellectual Property Office, and Korean Patent Application No. 10-2016-0165753, filed on Dec. 7, 2016 in the Korean Intellectual Property Office, the disclosures of which are incorporated herein by reference.

BACKGROUND

1. Field

The following description relates to a magnetron cooling fin and a magnetron having the same, and more particularly, to a magnetron cooling fin which may cool a heated magnetron by one or a plurality of corrugated regions being processed around a through-hole and a structure of a magnetron having the same.

2. Description of the Related Art

A magnetron generates strong high frequency waves by applying a magnetic field to control a flow of electrons and is used in a high-frequency heating apparatus such as a microwave oven.

A generation of thermal stress and thermal fatigue due to a generation of high temperature heat for cooking food and a generation of repetitive high frequency waves may cause deterioration in the lifetime and performance of the magnetron. Forced cooling through a plurality of cooling fins in contact with an anode unit of the magnetron and a cooling fan of an electric element chamber may be used to cool a heated magnetron.

It is necessary to effectively cool the anode unit, which has the highest temperature in the magnetron, and to improve cooling efficiency of a cooling fin which is brought into contact with the anode unit to receive heat therefrom.

SUMMARY

Additional aspects of the disclosure will be set forth in part in the description which follows and, in part, will become obvious from the description or may be learned by practicing the disclosure.

In accordance with an aspect of the present disclosure, a magnetron cooling fin includes: a body that includes a through-hole through which an anode unit of a magnetron passes in a central region thereof, a fin collar bent in a first direction at an edge of the through-hole, and a plurality of concave oval-shaped regions positioned to be spaced apart from each another at a set angle from a center point of the through-hole and concave in a direction opposite to the first direction; and a plurality of fins that extend from both sides of the body, wherein a distance from the center point of the through-hole to a center point of the oval-shaped region is larger than a radius of the through-hole.

Here, the distance from the center point of the through-hole to the center point of the oval-shaped region may be larger than a vertical length of the body.

Also, the distance from the center point of the through-hole to the center point of the oval-shaped region may be smaller than a transverse length of the body.

Also, a height of the fin collar may be larger than a depth of the concave oval-shaped region.

Also, the set angle may be 25° or more and 65° or less.

Also, a transverse length of the oval-shaped region may be 1.4 times or more and 2.8 times or less a vertical length thereof.

Also, a long axis of the oval-shaped region may be inclined with respect to a transverse direction of the body.

Also, one of a set distance from the center point of the through-hole to the center point of the oval-shaped region and the set angle may be changed corresponding to the number of the oval-shaped regions.

In accordance with an aspect of the present disclosure, a magnetron cooling fin includes a body that is connected to a through-hole through which an anode unit of a magnetron passes, a fin collar bent at an edge of the through-hole, and a first corrugated region formed from a lower end of the fin collar; and a plurality of fins that extend from both sides of the body, wherein a diameter of the through-hole is smaller than an outer diameter of the first corrugated region.

Here, a height of the fin collar may be larger than a height of the first corrugated region.

Also, the first corrugated region may have a stepped portion, and the outer diameter of the first corrugated region may be larger than a diameter of the stepped portion.

Also, a shape of the first corrugated region may be one of a circular shape and an elliptical shape.

Also, the magnetron cooling fin may further include a plurality of second corrugated regions that are positioned at a corner region of the body.

Also, the plurality of second corrugated regions may guide a flow of air.

Also, a shape of the second corrugated region may be a truncated pyramid shape.

Also, a height of the second corrugated region may be smaller than a height of the fin collar.

In accordance with an aspect of the present disclosure, a magnetron cooling fin includes: a body that includes a through-hole through which an anode unit of a magnetron passes in a central region thereof, a fin collar bent at an edge of the through-hole, and a plurality of first corrugated regions spaced apart from the fin collar by a set interval and positioned at a corner region of the body; and a plurality of fins that extend from both sides of the body, wherein the set interval is smaller than one of a transverse length and a vertical length of the first corrugated region.

Here, the set interval may be smaller than a transverse length and a vertical length of a second corrugated region.

BRIEF DESCRIPTION OF THE DRAWINGS

The patent or application file contains at least one drawing executed in color. Copies of this patent or patent application publication with color drawings will be provided by the Office upon request and payment of the necessary fee. These and/or other aspects of the disclosure will become apparent and more readily appreciated from the following description of the embodiments, taken in conjunction with the accompanying drawings of which.

DETAILED DESCRIPTION

Figure 1:
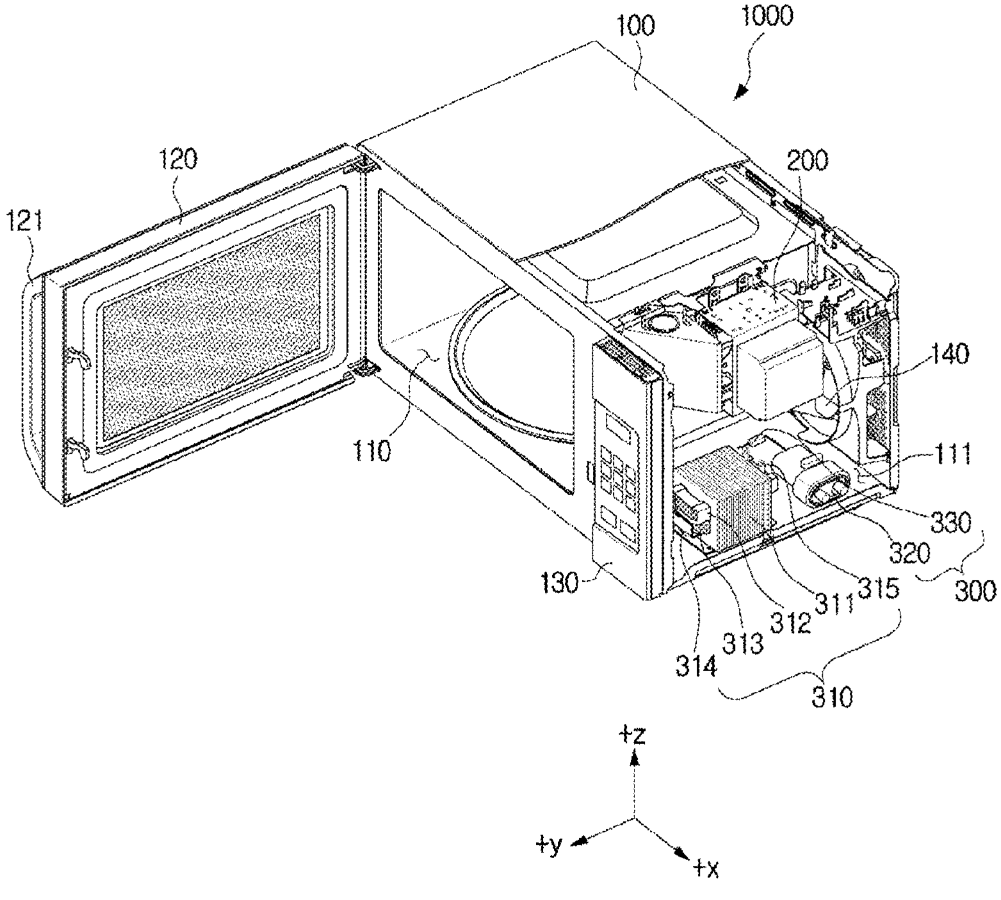
FIG. 1 is a schematic perspective view showing a high-frequency heating apparatus including a magnetron according to an embodiment of the present disclosure.

Hereinafter, exemplary embodiments of the present disclosure will be described with reference to the accompanying drawings. Like reference numbers or designations in the various drawings indicate components or components that perform substantially the same function.

Terms including ordinals such as first, second, etc. may be used to describe various elements, but the elements are not limited by the terms. The terms are used only for differentiating one element from another element. For example, a second element may be referred to as a first element, and a first element may also be referred to as a second element without departing from the scope of the present disclosure. The term "and/or" includes a combination of a plurality of related described items or any item among the plurality of related described items.

The terms used in this application are merely used for describing particular embodiments and are not intended to limit the present disclosure. A singular expression includes a plural expression unless clearly indicated otherwise in context. In this application, the terms "include" or "have" are for designating that features, numbers, steps, operations, elements, parts described in this specification or combinations thereof exist and are not to be construed as excluding the presence or possibility of adding one or more other features, numbers, steps, operations, elements, parts, or combinations thereof.

Like reference numerals in the drawings denote members performing substantially the same function.

Hereinafter, embodiments of the present disclosure will be described in detail with reference to the accompanying drawings.

A forward direction used in the following description may refer to a direction extending outward with respect to a door 120 (or a surface of the door) of a microwave oven 1000 (for example, a +y-axis direction) as shown in FIG. 1. The front surface may refer to a surface corresponding to the door 120 facing the forward direction. Further, a rear direction may refer to a direction opposite to the forward direction of the microwave oven 1000 (e.g., a −y-axis direction).

FIG. 1 is a schematic perspective view showing a high-frequency heating apparatus including a magnetron according to an embodiment of the present disclosure.

Referring to FIG. 1, a microwave oven (a body including a case and a door, hereinafter collectively referred to as the microwave oven 1000), which is a high-frequency heating apparatus, may include a cooking chamber 110, an electric element chamber 111, a door 120, an operation panel 130, a fan 140, a magnetron 200, electrical elements 300, and high voltage transformer 310. The magnetron 200 of the present disclosure may be employed in a high-frequency heating apparatus.

A case 100 that forms an outer appearance of the high-frequency heating apparatus is divided into the cooking chamber 110 positioned inside the case 100 and the electric element chamber 111 positioned adjacent to the cooking chamber 110.

The cooking chamber 110, which is in the form of a polyhedron, may be implemented in such a manner that a front surface thereof (for example, a surface corresponding to the door 120) is open for inserting or withdrawing food to be cooked. The case 100 may include an opening corresponding to the cooking chamber 110 having an open surface.

The electric element chamber 111 may be distinguished from the outside, and one or a plurality of electric elements for heating (or cooking) food may be positioned therein.

The open front surface of the cooking chamber 110 may be opened and closed by the door 120. The door 120 may be hinged at one side (e.g., a lower side or a side surface) of the case 100 to be rotatable. A handle 121 held by a user may be positioned on an outside of the door 120.

The operation panel 130 for receiving a user input for cooking food and displaying information (e.g., a food name, an operation time, etc.) corresponding to cooking the food is provided on a front surface of the electric element chamber 111. The fan 140 for drawing outside air into the electric element chamber 111 and cooling the various electric elements inside the electric element chamber may be positioned in the electric element chamber 111. In addition, the fan 140 may discharge air to the outside of the electric element chamber 111 in order to cool the inside of the electric element chamber 111 heated by the various electric elements.

Figure 2:
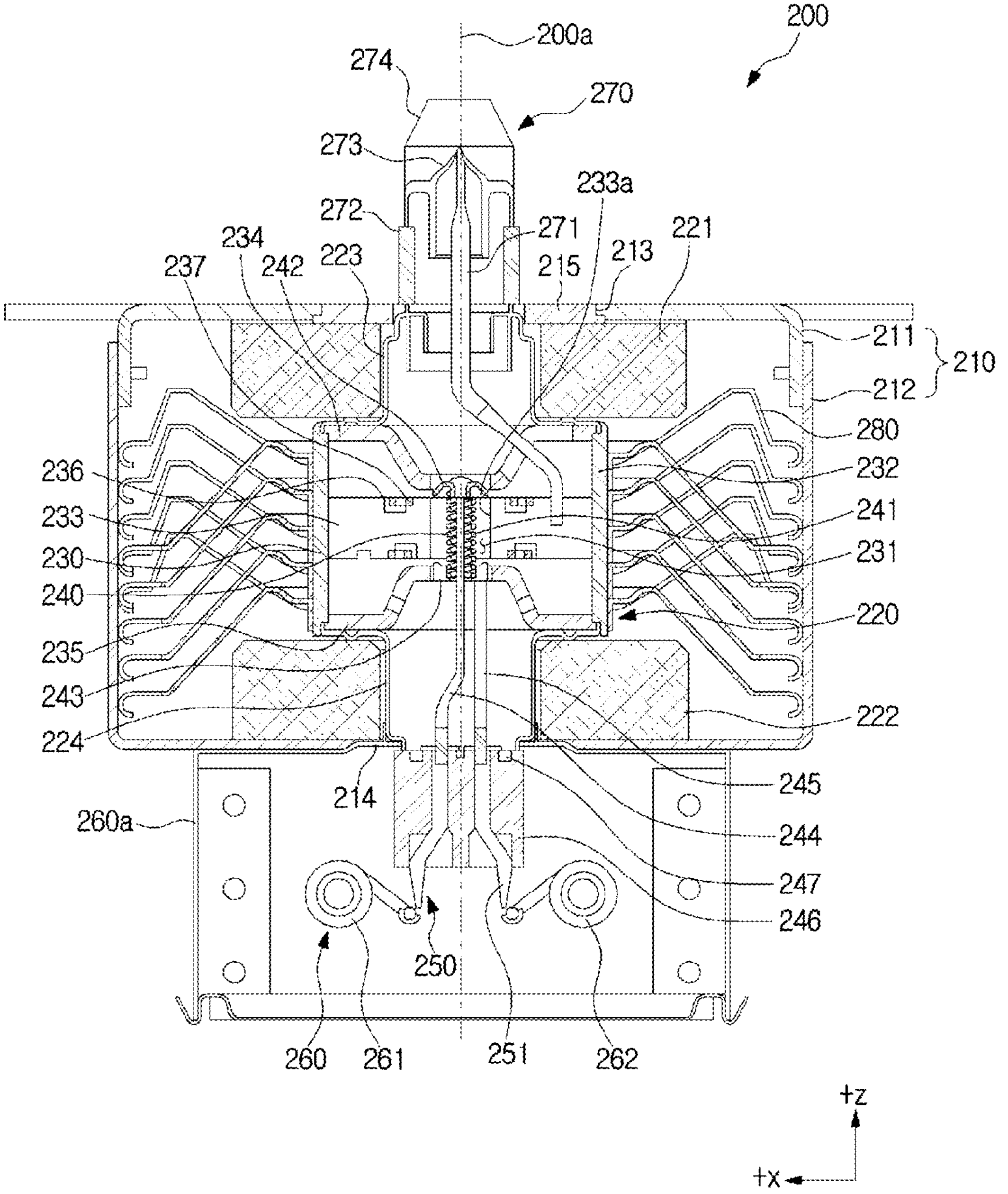
FIG. 2 is a schematic cross-sectional view showing a magnetron according to an embodiment of the present disclosure.

The magnetron 200 which generates microwaves to be radiated into the cooking chamber 110 may be positioned in the electric element chamber 111. In FIG. 2, a detailed description of the magnetron 200 will be made.

A driving module (for example, a high voltage transformer 310, or the electrical elements 300 including a high voltage condenser 320, and/or a high voltage diode 330) which operates the magnetron 200 may be positioned in the electric element chamber 111. For example, the high voltage transformer 310 receives commercial AC power (AC 110V or 220V) and outputs a voltage of about 2,000V. The voltage output from the high voltage transformer 310 is maintained at about 4,000V by the high voltage condenser 320 or the high voltage diode 330.

The magnetron 200 may generate microwaves of 2.45 GHz using an input high voltage.

The high voltage transformer 310 may include a coil 311 made by stacking steel plates such as silicon steel plates, permalloy, or ferrite, and a primary coil 312 and a secondary coil 313 wound around the coil 311. Commercial power is input at an input terminal 314 of the primary coil 312. A high voltage power is output through an output terminal 315 of the secondary coil 313.

An operation of the microwave oven 1000 is as follows.

A user may place food to be cooked in the cooking chamber 110 and operate the microwave oven 1000 through the operation panel 130. The high voltage transformer 310 to which commercial power is applied boosts the commercial power to about 2,000V. The boosted power is delivered to the magnetron 200 at a high voltage of about 4,000 V by the high voltage condenser 320 and the high voltage diode 330.

Thermo electrons are emitted from a filament 241 heated by the power being applied to the filament 241 of the magnetron 200 through a center lead 244 and a side lead 245 of a cathode unit 240.

A group of electrons is formed by thermo electrons being emitted into a working space 231 between the filament 241 and a plurality of vanes 233.

A strong electric field is formed in the working space 231 by a driving voltage being applied to an anode unit 230. A magnetic field generated by a first magnet 221 and a second magnet 222 acts in a vertical direction through a first pole piece 234 and a second pole piece 235.

The group of electrons emitted from the filament 241 into the working space 231 travels in a direction of the vanes 233 by a spiral rotational motion under influence of the strong electric field and the magnetic field. High frequency waves of a resonance frequency corresponding to a rotational speed of the group of electrons are derived from the vanes 233.

The high frequency waves derived from the plurality of vanes 233 is transmitted to an outside of a yoke 210 through an antenna lead 271 and guided to a waveguide tube (not shown) through an antenna cap 274.

The magnetron 200 may radiate microwaves of a 2.45 GHz band generated by a high-frequency generator 220 into the cooking chamber 110 to cook food inside the cooking chamber 110.

The microwave oven 1000, which is cooking food, may operate the fan 140 for cooling the high-temperature magnetron 200 or the high-temperature high voltage transformer 310 to cool an interior temperature of the electric element chamber 111. The magnetron 200 may be cooled through a plurality of cooling fins 280.

FIG. 2 is a schematic cross-sectional view showing a magnetron according to an embodiment of the present disclosure.

Referring to FIG. 2, the magnetron 200 includes the yoke 210 having a receiving space therein and a high-frequency generator 220 that is positioned inside the yoke 210 and generates high frequency waves.

The high-frequency generator 220 includes the first magnet 221 as an annular permanent magnet provided in an opening (not shown) of the yoke 210, the second magnet 222 as an annular permanent magnet provided facing the first magnet 221, the anode unit 230 disposed between the first magnet 221 and the second magnet 222, and the cathode unit 240 disposed inside the anode unit 230.

In the high-frequency generator 220, the yoke 210, including a first yoke 211 and a second yoke 212, the first magnet 221, and the second magnet 222 may surround the anode unit 230 and the cathode unit 240 to form a magnetic circuit.

The magnetron 200 further includes an input unit 250 which applies power to the high-frequency generator 220, a filter unit 260 connected to the input unit 250, and an output unit 270 which radiates the high frequency waves generated from the high-frequency generator 220 to the outside of the yoke 210.

An opening 213 which the output unit 270 of the high-frequency generator 220 passes through is formed in a central region of the first yoke 211. A connection hole 214 which the input unit 250 of the high-frequency generator 220 is connected to is formed in a central region of the second yoke 212.

A gasket 215 which prevents electromagnetic waves generated inside the yoke 210 from being leaked to the outside of the yoke 210 may be positioned in the high-frequency generator 220.

The first yoke 211 may be coupled to a waveguide tube (not shown) of the high-frequency apparatus through a coupling protrusion (not shown) being inserted into a coupling groove (not shown) of the waveguide tube (not shown). The output unit 270 may be inserted into a guide groove (not shown) of the waveguide tube to radiate high frequency waves into the waveguide tube.

A first sealing member 223 and a second sealing member 224 which fix the anode unit 230 and seal the inside of the anode unit 230 may be positioned in the high-frequency generator 220.

A flange extending outward from the first sealing member 223 and the second sealing member 224 may be welded and coupled to upper and lower portions of the anode unit 230.

The plurality of stacked cooling fins 280 (for example, three to six) which cool the heated anode unit 230 may be positioned on an outer periphery of the anode unit 230. The plurality of cooling fins 280 may be brought into contact with the outer periphery of the high-temperature anode unit 230 heated by high frequency waves to cool the anode unit 230 through conductive heat transfer. In addition, the anode unit 230 may be cooled through naturally convective heat transfer due to an internal temperature difference between the plurality of cooling fins 280 and the electric element chamber 111 and forced convective heat transfer through the fan 140.

The anode unit 230 may include an anode cylinder 232 that is surrounded by the plurality of cooling fins 280 to form the working space 231 in the central region thereof, the plurality of vanes 233 (for example, nine to eleven) which are radially arranged with respect to a center axis 200*a* of the working space 231, and the first pole piece 234 and the second pole piece 235 which are respectively installed in upper and lower portions of the anode cylinder 232 so that a magnetic field generated by the first magnet 221 and the second magnet 222 can be concentrated in the working space 231.

An outer end of the plate-like (for example, polygonal) vane 233 may be fixed to an inner surface of the anode cylinder 232, and an inner end thereof may be fixed by a plurality of strap rings 236 and 237. The strap rings 236 and 237 may have different sizes (e.g., diameters). Each of the pole pieces 234 and 235 may have a shape of a funnel.

A distal end 233*a* of the vane 233 which is not fixed to the inner surface of the anode cylinder 232 is disposed in the same inscribed circle extending along the center axis 200*a*.

The cathode unit 240 separated from each of the vanes 233 includes the coil-shaped filament 241 which is disposed at a center of the inscribed circle of the vane 233 and installed at a central region of the working space 232, a first end hat 242 and a second end hat 243 which are respectively coupled to an upper end and a lower end of the filament 241, the center lead 244 which is installed at a center of the filament 241 and has an upper end coupled to the first end hat 242 and a lower end passing through the second end hat 243 and extending downward, and the side lead 245 which is coupled to a periphery of the second end hat 243.

Ends of the filament 241 are respectively mounted to the first end hat 242 and the second end hat 243. The first end hat 242 and the second end hat 243 may suppress electron leakage from the working space 231.

The center lead 244 and the side lead 245 connected to an external power source may apply power to the filament 241. Lower portions of the center lead 244 and the side lead 245 are surrounded and fixed by a first insulator 246.

When power is applied to the center lead 244 and the side lead 245, the filament 241 emits thermo electrons toward the vane 233.

The center lead 244 and the side lead 245 protrude from the yoke 210 through a relay plate 247 and are connected to input terminals 251.

The input unit 250 includes a pair of input terminals 251 respectively connected to the center lead 244 and the side lead 245. The input unit 250 may further include a plug (not shown) connected to the pair of input terminals 251.

The filter unit 260 connected to the input unit 250 includes a plurality of filters 261 and 262 as a choke coil. The filter unit 260 includes a filter box 260*a* which is coupled to the second yoke 212 and covers the connection hole 241 to prevent electromagnetic waves generated by the anode cylinder 232 from being leaked to the outside through the connection hole 214. A high-pressure condenser (not shown) is formed to pass through the filter box 260*a*.

The output unit 270 positioned above the first pole piece 234 radiates microwaves. An end of the output unit 270 is connected to one of the plurality of vanes 233 to radiate high frequency waves to the outside of the yoke 210, and the other end of the output unit 270 is provided with an antenna lead 271 that extends outward through the opening 213.

The output unit 270 further includes a second insulator 272 that is bonded to the first sealing member 223 and through which the antenna lead 271 passes therein, a vent tube 273 that is coupled to the second insulator 272 and through which the antenna lead 271 passes, and an antenna cap 274 that covers the vent tube 273. The antenna lead 271 passes through the first pole piece 234 and is installed to extend inside the output unit 270, and a distal end of the antenna lead 271 is fixed to the vent tube 273. The second insulator 272 is bonded to the first sealing member 232 and is bonded to the opposite side of the first pole piece 234 connected to the first sealing member 232.

The opening of the yoke is coupled to one side of the second insulator 272, and the vent tube 273 is bonded to the other side of the second insulator 272.

Figure 3A:
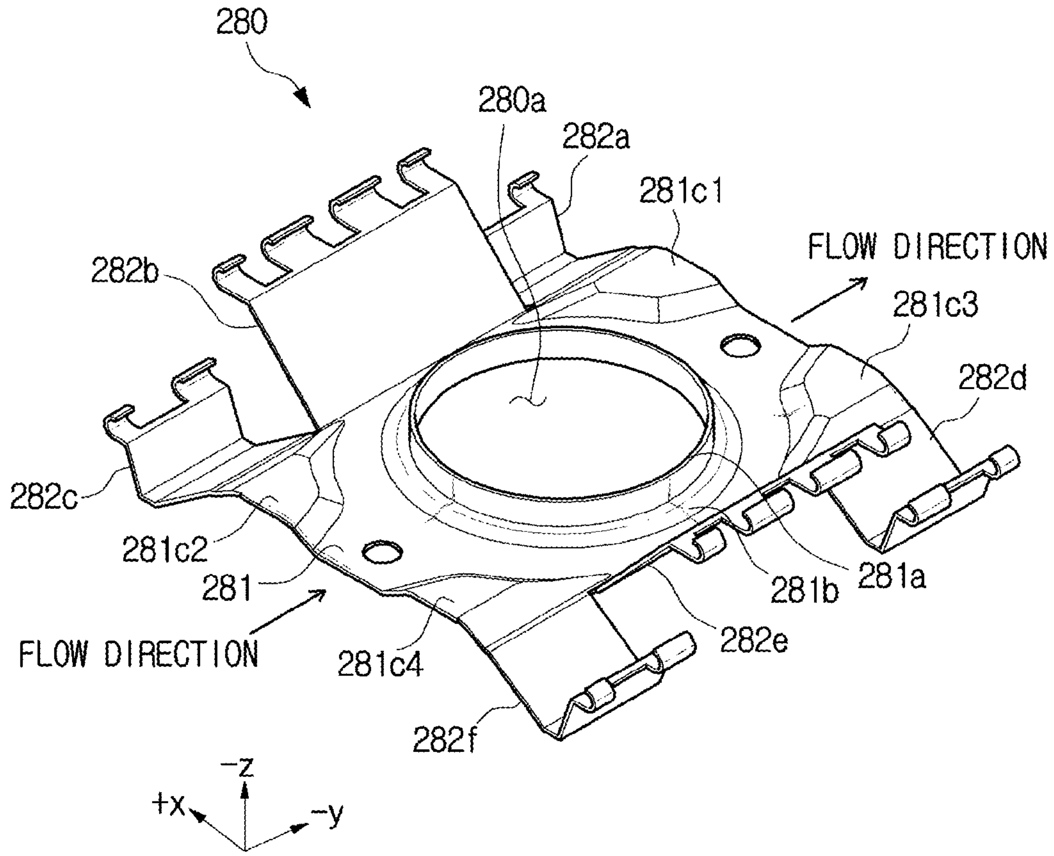
FIGS. 3A and 3B are a schematic perspective view and a cross-sectional view showing a cooling fin according to an embodiment of the present disclosure.
Figure 3B:
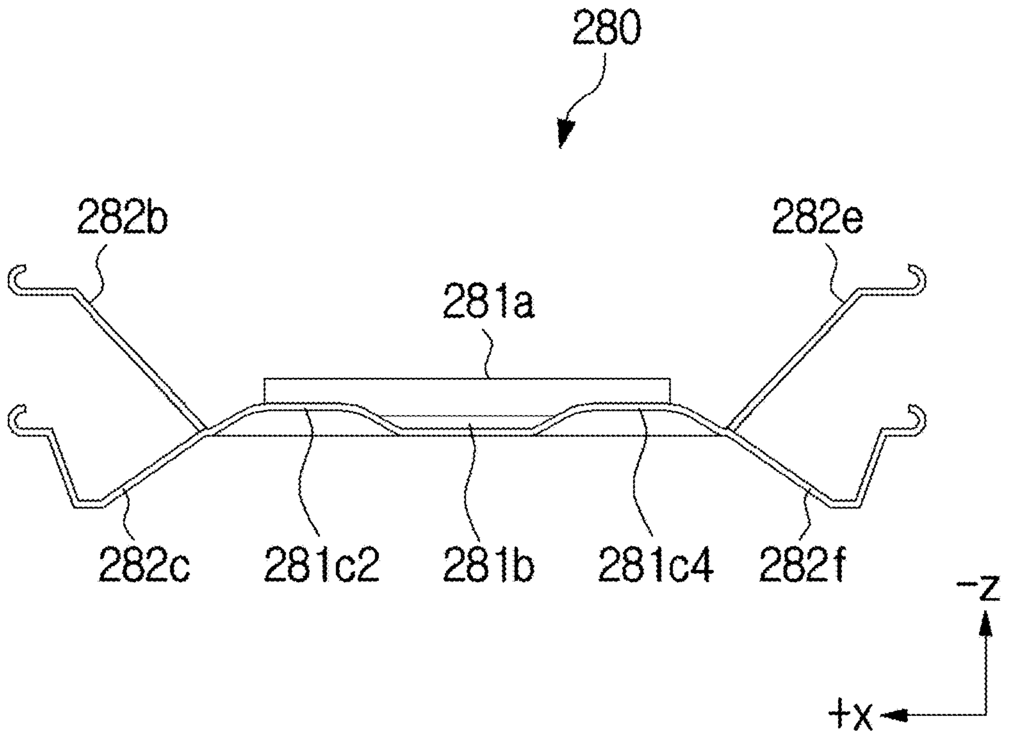

FIGS. 3A and 3B are a schematic perspective view and a cross-sectional view showing a cooling fin according to an embodiment of the present disclosure.

Figure 4A:
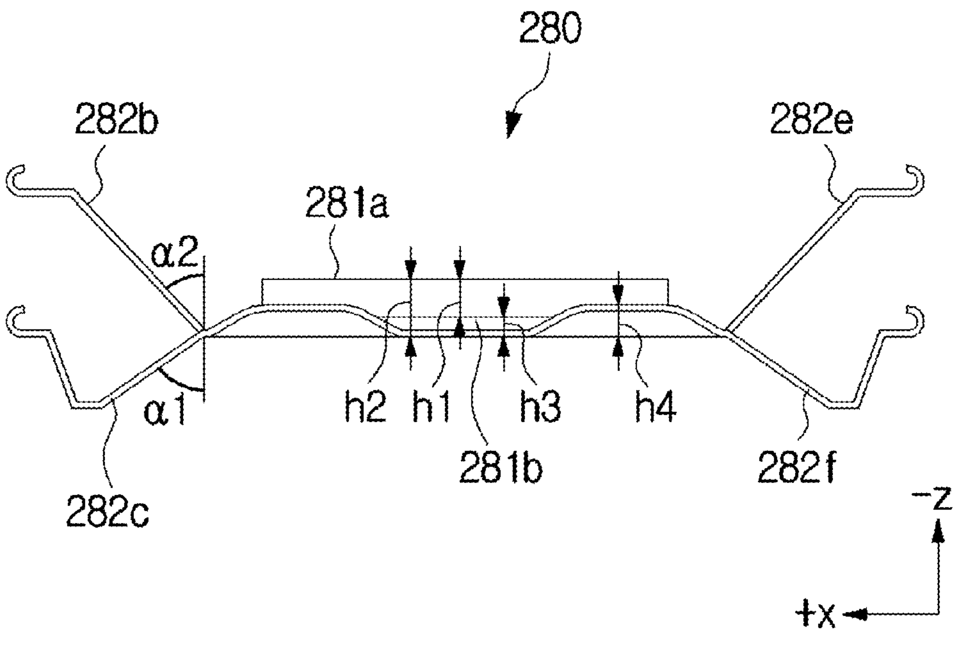
FIGS. 4A and 4B are a detailed plan view and a cross-sectional view showing a cooling fin according to an embodiment of the present disclosure.
Figure 4B:
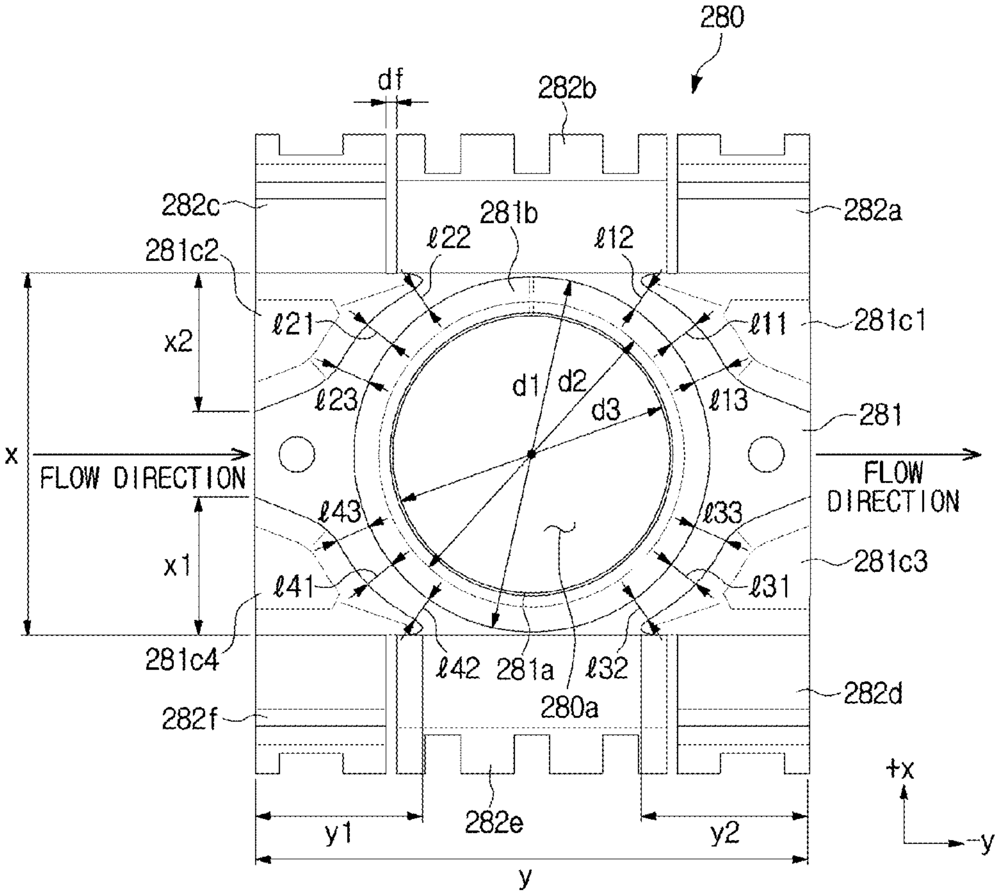

FIGS. 4A and 4B are a detailed plan view and a cross-sectional view showing a cooling fin according to an embodiment of the present disclosure.

Referring to FIGS. 3A to 4B, the cooling fin 280 that is brought into contact with the outer periphery of the anode unit 230 and cools the heated anode unit 230 has a plate shape. The cooling fin 280 is divided into the body 281 formed in a central region thereof and a plurality of fins 282 (for example, 282*a* to 282*f*).

The cooling fin 280 is divided into the body 281 of the central region, and the plurality of multi-stage fins 282 (for example, 282*a* to 282*f*) formed by both side surfaces of the body 281 being bent.

A material of the cooling fin 280 may include aluminum or an aluminum alloy. For example, the material of the cooling fin 280 may include A1050, A1406, A1100, A1199, A2014, A2024, or A2219. In addition, the material of the cooling fin 280 may include a light metal (for example, magnesium or the like) capable of cooling the magnetron 200 or a light metal alloy as well as aluminum.

The cooling fin 280 may be formed through press processing (e.g., including shearing, deep drawing, bending, forging, extrusion, or stamping). The cooling fin 280 may be formed by press processing a plurality of times.

A through-hole 280*a* that passes through the anode unit 230 is formed at a central region of the body 281. The body 281 may include a fin collar 281*a* that has a first diameter d3 (e.g., 39.8 mm, but changeable) and is bent in one direction (e.g., in a z-axis direction, but changeable during manufacture) along an edge of the through-hole 280*a*, and a first corrugated region 281*b* that has a second diameter d1 (e.g., 49.9 mm, but changeable) and connects a lower end of the fin collar 281*a* and the body 281. The first corrugated region 281*b* may be referred to as a ring-shaped corrugated region. The first corrugated region 281*b* may have an elliptical shape. In addition, the diameter of the first corrugated region 281*b* may be defined as an outer diameter in a ring shape.

The fin collar 281*a* may be brought into contact with an outer periphery of the anode unit 230. A height h1 of the fin collar 281*a* may be 3.6 mm. For example, the height h1 of the fin collar 281*a* may be in a range from 2.1 mm or more to 5.0 mm or less.

According to an embodiment of the present disclosure, a contact area of the fin collar 281*a* of the cooling fin 280 that is brought into contact with the outer periphery of the anode unit 230 may be increased along with an increase in the height h1 of the fin collar 281*a*. The contact area of the cooling fin 280 that is brought into contact with the outer periphery of the anode unit 230 may be increased along with an increase (for example, based on the bottom of the body 281) in the height h1 of the fin collar 281*a*. In addition, cooling efficiency of the cooling fin 280 may be also increased along with an increase in the height h1 of the fin collar 281*a*.

The first corrugated region 281*b* may be connected from a first position where the lower end of the fin collar 281*a* and the first corrugated region 281*b* meet to a second position where the first corrugated region 281*b* and a planar portion of the body 281 meet. A diameter d3 of the first position may be substantially similar (e.g., a difference of ±0.8 mm or less) to a transverse length (e.g., an x-axis direction) of the body 281. A diameter d1 of the second position may be less than or equal to the transverse length (e.g., the x-axis direction) of the body 281.

A height h3 of the first corrugated region 281*b* may be lower than the height h1 of the fin collar 281. A total height h2 of the body 281 obtained by adding the height h1 of the fin collar 281*a* and the height h3 of the first corrugated region 281*b* may be at least twice the height h3 of the first corrugated region 281*b*. For example, the total height h2 of the body 281 may be 1.5 to 3.5 times the height h3 of the first corrugated region 281*b*.

A cross section of the first corrugated region 281*b* connected from the first position where the lower end of the fin collar 281*a* and the first corrugated region 281*b* meet to the second position where the first corrugated region 281*b* and the planar portion of the body 281 meet may have an arc shape.

A surface area of the arc-shaped first corrugated region 281*b* may be wider than an area (e.g., an area at the second position—an area at the first position) of the virtual first corrugated region 281*b* projected onto a flat plate of the body 281. For example, the surface area of the first corrugated region 281*b* may be 1.57 times the area of the virtual first corrugated region 281*b* at the first position. In addition, the surface area of the first corrugated region 281*b* may be 1.1 to 2.0 times the area of the virtual first corrugated region 281*b* at the first position.

According to an embodiment of the present disclosure, cooling efficiency of the cooling fin 280 may be increased by the first corrugated region 281*b* being processed to increase an area (or a surface area) thereof in contact with air. In addition, the cooling efficiency of the cooling fin 280 may be increased along with an increase in the area (or the surface area) of the first corrugated region 281*b* in contact with air.

The first corrugated region 281*b* may have a stepped portion (e.g., a shape of a plurality of arcs or a stepped shape). When the first corrugated region 281*b* has the stepped portion, a diameter d2 of the stepped portion may have a value (e.g., 46.9 mm, but changeable) between the diameter d3 of the fin collar 281*a* and the diameter d1 of the first corrugated region 281*b*.

According to an embodiment of the present disclosure, the first corrugated region 281*b* may promote turbulence of a flow.

The body 281 may further include a second corrugated region 281*c* in a plurality of corner areas (e.g., including between the body 281 and the fin 282). The second corrugated region 281*c* may be referred to as a bank type corrugated region. A plurality of second corrugated regions 281*c*1 to 281*c*4 may guide a flow stream. A velocity of the flow stream may be accelerated in a direction of the fan 140 by the plurality of second corrugated regions 281*c*1 to 281*c*4.

The plurality of second corrugated regions 281*c*1 to 281*c*4 may be spaced apart from the opposing first corrugated region 281*b* by set intervals (e.g., l11 to l43). The set intervals (e.g., l11 to l43) may be in a range from 1.5 mm or more to 8.0 mm or less. The set intervals (e.g., l11 to l43) are larger (or longer) than the height h3 of the first corrugated region 281*b*. In addition, the set intervals (e.g., l11 to l43) may be larger than or smaller than the total height h2 of the body 281.

The set intervals (e.g., l11 to l13) between a single opposing second corrugated region 281*c*1 and the first corrugated region 281*b* may be the same as or different from each other. Each set of the intervals may be a position l12 or l13 that protrudes toward the first corrugated region 281*b* from the single second corrugated region 281*c*1, or a concave position l11. For example, l11 may be 3.7 mm, l12 may be 3.82 mm, and l13 may be 4.85 mm. The above-described set intervals are substantially similar (for example, a positional difference of the second corrugated region) to those in the remaining second corrugated regions 281*c*2 to 281*c*4, and therefore repeated descriptions thereof will be omitted.

According to an embodiment of the present disclosure, the outer air in contact with the heated anode unit 230 may be accelerated through the set intervals and moved in the direction of the fan 140.

The plurality of second corrugated regions 281*c*1 to 281*c*4 may be processed by a compressive load at an edge area of the body 281. In the second corrugated regions 281*c*1 to 281*c*4, an area of a (virtual) bottom surface and an area of a protruding upper surface may be different from each other due to the processing. For example, the second corrugated regions 281*c*1 to 281*c*4 may be similar to a shape of a frustum of a pyramid. Corners connecting vertexes of the (virtual) bottom surface of the second corrugated regions 281*c*1 to 281*c*4 may be a curved line or a parabola.

A transverse length x1 of the single second corrugated region 281*c*4 may be 49% or less of a transverse length x of the body 281. For example, the transverse length x1 of the single second corrugated region 281*c*4 may be 40% or less of the transverse length x of the body 281. A sum of transverse lengths x1 and x2 of the plurality of second corrugated regions 281*c*4 and 281*c*2 may be 83% or less of the transverse length x of the body 281. For example, the sum of the transverse lengths x1 and x2 of the plurality of second corrugated regions 281*c*4 and 281*c*2 may be 78% or less of the transverse length x of the body 281.

A vertical length $y_1$ of the single second corrugated region 281*c*4 may be 44% of less of a vertical length y of the body 281. For example, the vertical length y1 of the single second corrugated region 281*c*4 may be 40% or less of the vertical length y of the body 281. A sum of vertical lengths y1 and y2 of the plurality of second corrugated regions 281*c*4 and 281*c*3 may be 91% or less of the vertical length y of the body 281. For example, the sum of the vertical lengths y1 and y2 of the plurality of second corrugated regions 281*c*4 and 281*c*3 may be 87% or less of the vertical length y of the body 281.

The above-described transverse and vertical lengths are substantially similar (for example, a positional difference on the second corrugated region) to those in the remaining second corrugated regions 281*c*1 to 281*c*3, and therefore repeated descriptions thereof will be omitted.

Referring to FIG. 4A, the plurality of second corrugated regions 281*c*1 to 281*c*4 may have a height h4. The body 281 may be implemented in a convex or concave shape due to the height h4 of the second corrugated regions 281*c*1 to 281*c*4. The plurality of second corrugated regions 281*c*1 to 281*c*4 may be processed by a compressive load to have the height h4. The height h4 of the second corrugated regions 281*c*1 to 281*c*4 may be a range of 0.9 mm or more and 4.0 mm or less.

The height h4 of the second corrugated regions 281*c*1 to 281*c*4 may be smaller than the height h1 of the fin collar 281*a* or the total height h2 of the body 281. In addition, the height h4 of the second corrugated regions 281*c*1 to 281*c*4 may be smaller than at least one of the transverse lengths and vertical lengths of the second corrugated regions 281*c*1 to 281*c*4.

According to an embodiment of the present disclosure, the set intervals (e.g., l11 to l43) may be smaller than the transverse length x1 of the single second corrugated region 281*c*1 of the plurality of second corrugated regions. In addition, the set intervals (e.g., l11 to l43) may be smaller than the transverse length x2 of the remaining second corrugated regions 281*c*2 to 281*c*4.

The set intervals (e.g., l11 to l43) may be smaller than the vertical length y1 of the single second corrugated region 281*c*1 of the plurality of second corrugated regions. In addition, the set intervals (e.g., l11 to l43) may be smaller than the vertical length y2 of the remaining second corrugated regions 281*c*2 to 281*c*4.

According to an embodiment of the present disclosure, the second corrugated region 281*c* may promote turbulence of a flow. In addition, cooling efficiency of the cooling fin 280 may be improved by the second corrugated region 281*c*.

According to an embodiment of the present disclosure, the body 281 of the cooling fin 280 may be implemented as the through-hole 280*a,* the fin collar 281*a,* and the second corrugated region 281*c*. The body 281 of the cooking fin 280 may be implemented in such a manner that a lower end of the fin collar 281*a,* which is bent in one direction (for example, in a −z-axis direction, but changeable during manufacture) along the edge of the through-hole 280*a*, and the body are connected without the first corrugated region 281*b*.

According to an embodiment of the present disclosure, in the case in which the body 281 of the cooling fin 280 implemented without the first corrugated region 281*b,* the second corrugated region 281*c* may be referred to as the first corrugated region.

According to an embodiment of the present disclosure, components of the body 281 of the cooling fin 280 implemented without the first corrugated region 281*b* are substantially similar to (for example, the presence and absence of the first corrugated region) the remaining components of the body 281 of the cooling fin 280 except for the first corrugated region 281*b* in an embodiment of the present disclosure (for example, shown in FIGS. 3A, 3B, 4A, and 4B), and therefore a repeated description thereof will be omitted.

According to an embodiment of the present disclosure, components of the body 281 of the cooling fin 280 implemented without the first corrugated region 281*b* are substantially similar to (for example, the presence and absence of the first corrugated region) the remaining components of the body 281 of the cooling fin 280 except for the first corrugated region 281*b* in an embodiment of the present disclosure (for example, shown in FIGS. 6A, 6B, 8A, and 8B), and therefore a repeated description thereof will be omitted.

A plurality of fins 282*a* to 282*c* or 282*d* to 282*f* are spaced apart from each other by an interval df (e.g., between 0.5 mm to 2.5 mm).

An interval of the plurality of fins 282*a* and 282*b* may be the same as or different from an interval of the plurality of fins 282*b* and 282*c*. An interval of the plurality of fins 282*d* and 282*e* may be the same as or different from an interval of the plurality of fins 282*e* and 282*f.* In addition, the interval of the plurality of fins 282*a* to 282*c* positioned at one side may be the same as or different from the interval of the plurality of fins 282*d* to 282*f* positioned at the other side.

The interval df between the plurality of fins 282*a* to 282*c* or 282*d* or 282*f* may be determined in consideration of cooling efficiency of the cooling fin or difficulty of processing.

The plurality of fins 282*a,* 282*c,* 282*d,* and 282*f* may be bent at an angle $\alpha 1$ (for example, 52° to 58°) in one direction (e.g., in the z-axis direction) and then unbent in another direction. In addition, the plurality of fins 282*b* and 282*d* may be bent at an angle $\alpha 2$ (for example, 43° to 49°) in one direction (e.g., in the −z-axis direction) and then unbent in another direction. An angle formed between the above-described plurality of fins 282*a* to 282*f* and a z-axis (or −z-axis) is merely an example, and it should be easily understood by those skilled in the art that the angle may be changed by at least one of a size of the yoke 210 of the magnetron 200 and the cooling efficiency of the cooling fin 280.

The ends of the plurality of fins 282*a* to 282*c* extending from the body 281 may have a hooked shape.

Figure 5A:
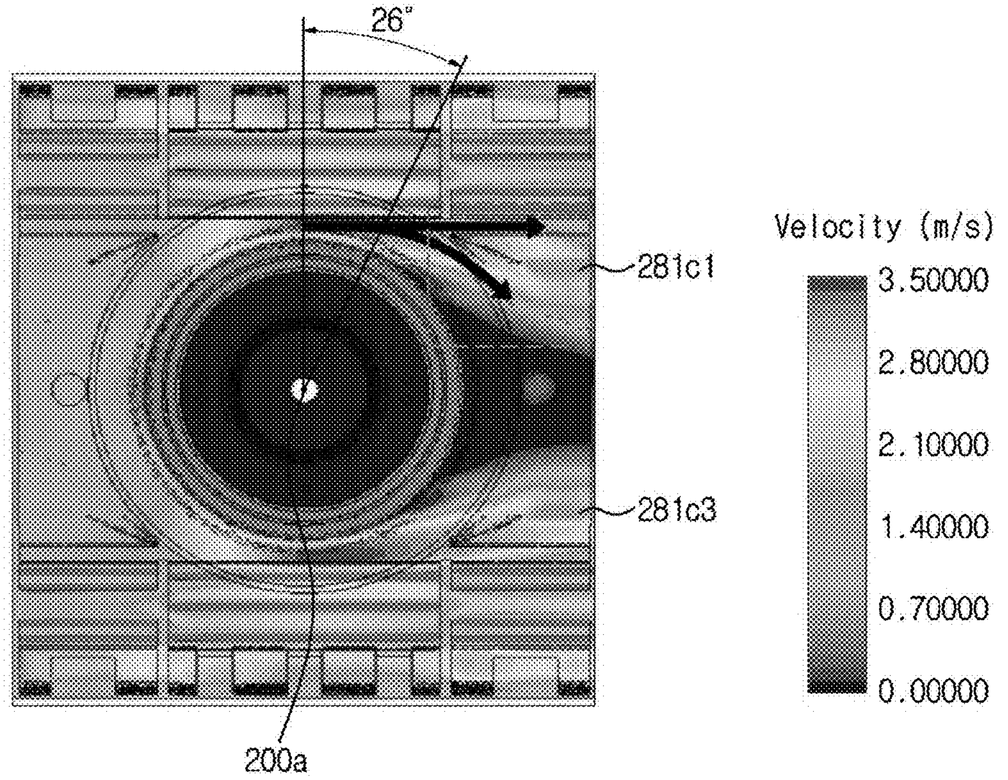
FIGS. 5A and 5B are schematic views showing a flow velocity distribution and a temperature distribution around a cooling fin according to an embodiment of the present disclosure.
Figure 5B:
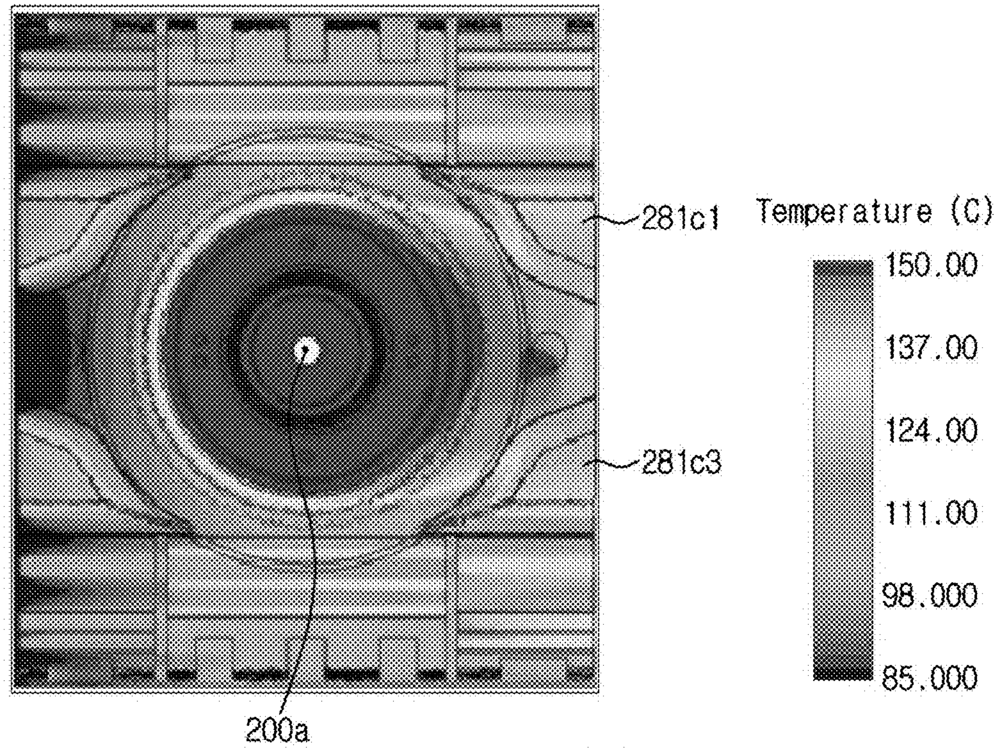

FIGS. 5A and 5B are schematic views showing a flow velocity distribution and a temperature distribution around a cooling fin according to an embodiment of the present disclosure.

FIGS. 5A and 5B respectively show a flow distribution around the cooling fin 280 and a temperature distribution around the cooling fin 280.

Referring to FIG. 5A, heat of the heated anode unit 230 may be conductive heat transferred to the cooling fin 280 so that the anode unit 230 may be naturally cooled through ambient air or forcedly cooled by rotation of the fan 140. Referring to experimental data, a flow rate thereof may be 0 to 3.5 m/s.

Air around the anode unit 230 passing through the through-hole 280*a* of the cooling fin 280 may collide with the anode unit 230 due to the rotation of the fan 140 to form a jet flow. A flow stream may be stopped or turbulence may occur behind the anode unit 230 based on a direction of the flow stream. This phenomenon is referred to as a flow separation phenomenon. A region (for example, a dead-zone) in which the flow stream is stopped by the flow separation phenomenon is formed.

When a dead-zone occurs, the flow stream is disturbed so that noise may be generated or cooling efficiency of the cooling fin 280 may be deteriorated. The farther downstream in a flow direction that the flow separation is generated, the more cooling efficiency of the cooling fin 280 is increased.

According to an embodiment of the present disclosure, turbulence of the flow may be promoted by at least one of the first corrugated region 281*b* and the second corrugated region 281*c* of the cooling fin 280.

According to an embodiment of the present disclosure, the flow separation of the cooling fin 280 may occur at a point 26° from the center 200*a* of the anode unit 230 in the flow direction. For example, a starting point of the flow separation may be generated at a point 22° to 30° from the center 200*a* of the anode unit 230 in the flow direction.

According to an embodiment of the present disclosure, the starting point of the flow separation of the cooling fin 280 having the first corrugated region 281*b* may be generated farther downstream in the flow direction in comparison to the starting point of the flow separation of an existing cooling fin (not shown) without the first corrugated region 281*b*. The starting point of the flow separation of the cooling fin 280 having the second corrugated region 281*c* may be generated farther downstream in the flow direction in comparison to the starting point of the flow separation of an existing cooling fin (not shown) without the second corrugated region 281*c*. In addition, the starting point of the flow separation of the cooling fin 280 having a combination of the first corrugated region 281*b* and the second corrugated region 281*c* may be generated farther downstream in the flow direction in comparison to the starting point of the flow separation of an existing cooling fin (not shown) without the first corrugated region 281*b* and the second corrugated region 281*c*.

Referring to FIG. 5B, heat of the heated anode unit 230 may be conductive heat transferred to the cooling fin 280 so that the anode unit 230 may be naturally cooled through ambient air or forcedly cooled by rotation of the fan 140. Referring to the experimental data, a flow temperature between the anode unit 230 and the cooling fin 280 may be between 85 to 150° C.

Air around the anode unit 230 passing through the through-hole 280*a* of the cooling fan 280 may collide with the anode unit 230 due to the rotation of the fan 140 to form a jet flow. A temperature of a dead-zone formed behind the anode unit 230 with respect to a direction of a flow stream is higher than a temperature outside the dead-zone.

The farther downstream in the flow direction a starting point of a flow separation is generated, the more cooling efficiency of the cooling fin 280 is increased (for example, a temperature is lowered).

According to an embodiment of the present disclosure, a temperature of the heated cooling fin 230 may be lowered by the flow separation of the cooling fin 280 which occurs at a point 26° from the center 200*a* of the anode unit 230 in the flow direction.

According to an embodiment of the present disclosure, the starting point of the flow separation of the cooling fin 280 having the first corrugated region 281*b* may be generated farther downstream in the flow direction in comparison to the starting point of the flow separation of the existing cooling fin (not shown) without the first corrugated region 281*b*, and thereby the cooling efficiency of the cooling fin 280 may be increased.

The starting point of the flow separation of the cooling fin 280 having the second corrugated region 281*c* may be generated farther downstream in the flow direction in comparison to the starting point of the flow separation of the existing cooling fin (not shown) without the second corrugated region 281*c*, and thereby the cooling efficiency of the cooling fin 280 may be increased. In addition, the starting point of the flow separation of the cooling fin 280 having a combination of the first corrugated region 281*b* and the second corrugated region 281*c* may be generated farther downstream in the flow direction in comparison to the starting point of the flow separation of the existing cooling fin (not shown) without the first corrugated region 281*b* and the second corrugated region 281*c*, and thereby the cooling efficiency of the cooling fin 280 may be increased.

According to an embodiment of the present disclosure, the cooling efficiency of the second corrugated region 281*c* may be higher than the cooling efficiency of the first corrugated region 281*b*.

According to an embodiment of the present disclosure, the number of the cooling fins 280 stacked on the magnetron 200 may be reduced due to at least one of the first corrugated region 281*b* and the second corrugated region 281*c* increasing the cooling efficiency of the cooling fin 280.

The number of the cooling fins 280 having the first corrugated region 281*b* (e.g., five) may be smaller than the number of the existing cooling fins (not shown) without the first corrugated region 281*b* (e.g., six). The number of the cooling fins 280 having the second corrugated region 281*c* (e.g., five) may be smaller than the number of the existing cooling fins (not shown) without the second corrugated region 281*c* (e.g., six). In addition, the number of the cooling fins having a combination of the first corrugated region 281*b* and the second corrugated region 281*c* (e.g., four or five) may be smaller than the number of the existing cooling fins (not shown) without the first corrugated region 281*b* and the second corrugated region 281*c* (e.g., six).

According to an embodiment, a thickness of the cooling fins 280 stacked on the magnetron 200 may be reduced due to the at least one of the first corrugated region 281*b* and the second corrugated region 281*c* increasing the cooling efficiency of the cooling fin 280.

A thickness (e.g., 0.4 mm) of the cooling fin 280 having the first corrugated region 281*b* may be smaller than a thickness (e.g., 0.6 mm) of the existing cooling fin (not shown) without the first corrugated region 281*b*. A thickness (e.g., 0.4 mm) of the cooling fin 280 having the second corrugated region 281*c* may be smaller than a thickness (e.g., 0.6 mm) of the existing cooling fin (not shown) without the second corrugated region 281*c*. In addition, a thickness (e.g., 0.25 to 0.4 mm) of the cooling fin 280 having a combination of the first corrugated region 281*b* and the second corrugated region 281*c* may be smaller than a thickness (e.g., 6 mm) of the existing cooling fin (not shown) without the first corrugated region 281*b* and the second corrugated region 281*c*.

Figure 6A:
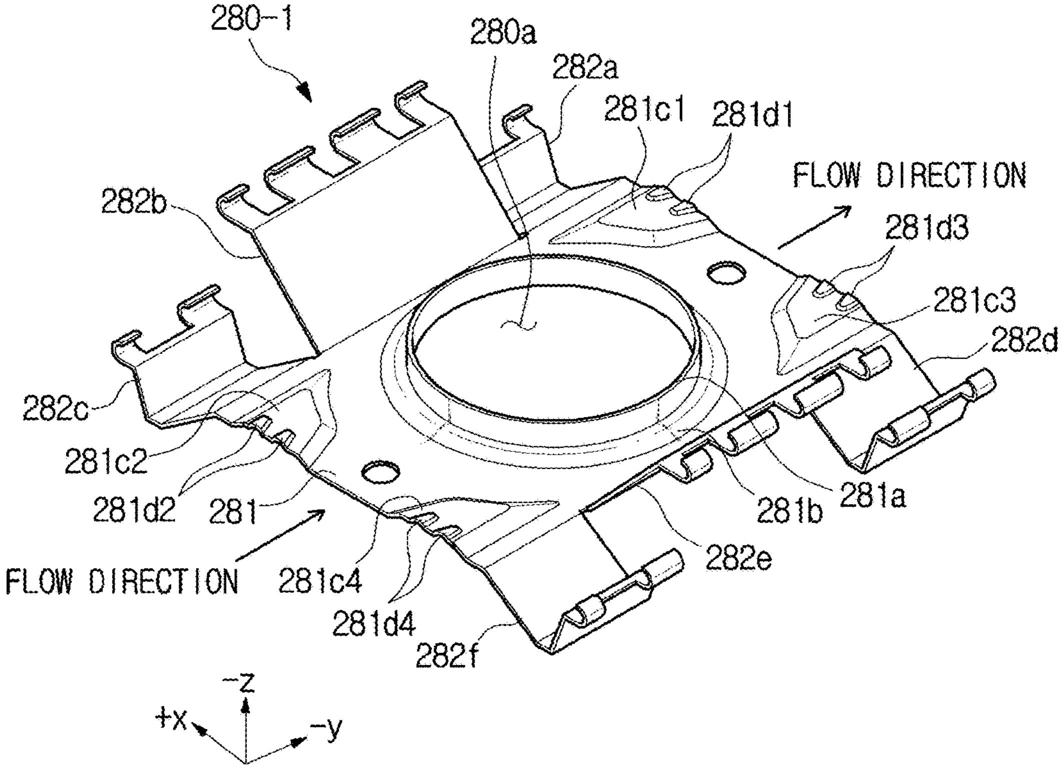
FIGS. 6A and 6B are a schematic perspective view and a cross-sectional view showing a cooling fin according to an embodiment of the present disclosure.
Figure 6B:
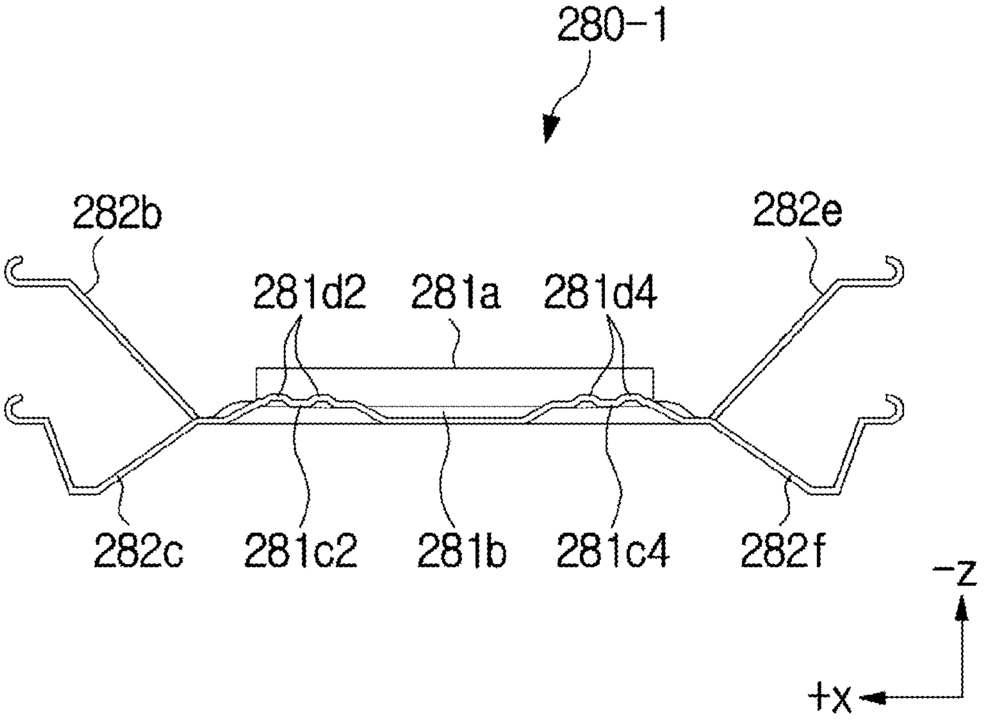

FIGS. 6A and 6B are a schematic perspective view and a cross-sectional view showing a cooling fin according to an embodiment of the present disclosure.

Referring to FIGS. 6A and 6B, a cooling fin 280-1 of FIGS. 6A and 6B is substantially similar to the cooling fin 280 of FIGS. 3A and 3B (for example, a difference therebetween is in the presence or absence of a bump 281*d*). For example, the cooling fin 280-1 of FIGS. 6A and 6B may include a dual structure second corrugated region 281*c* having the bump 281*d*.

Components 280*a*, 281*a*, 281*b*, and 282 of the cooling fin 280-1 of FIGS. 6A and 6B may be the same as the components 280*a*, 281*a*, 281*b*, and 282 of the cooling fin 280 of FIGS. 3A and 3B.

In the cooling fin 280-1 of FIGS. 6A and 6B, the bump 281*d* may be formed on an upper surface of the second corrugated region 281*c* of the cooling fin 280 of FIGS. 3A and 3B. A plurality of bumps 281*d*1 to 281*d*4 may be respectively formed on a plurality of second corrugated regions 281*c*1 to 281*c*4. For example, a single bump 281*d*1 may be formed on the second corrugated region 281*c*1. In the same manner, the remaining bumps 281*d*2 to 381*c*4 may be formed on the remaining second corrugated regions 281*c*2 to 281*c*4.

A shape of the bump 281*d* may be similar to or different from a shape of the second corrugated region 281*c*. For example, the shape of the bump 281*d* may be similar to the shape of the reduced second corrugated region 281*c*.

The bump 281*d* may be formed only on the second corrugated regions (e.g., 281*c*1 and 281*c*3) corresponding to a downstream region of the flow.

According to an embodiment of the present disclosure, turbulence of the flow due to the flow separation may be promoted by the second corrugated region 281*c* having the bump 281*d* in the cooling fin 280-1. A magnitude of the turbulence of the flow caused by the second corrugated region 281*c* having the bump 281*d* in FIGS. 6A and 6B may be greater than a magnitude of the turbulence of the flow caused by the second corrugated region 281*c* of FIGS. 3A and 3B.

Figure 7A:
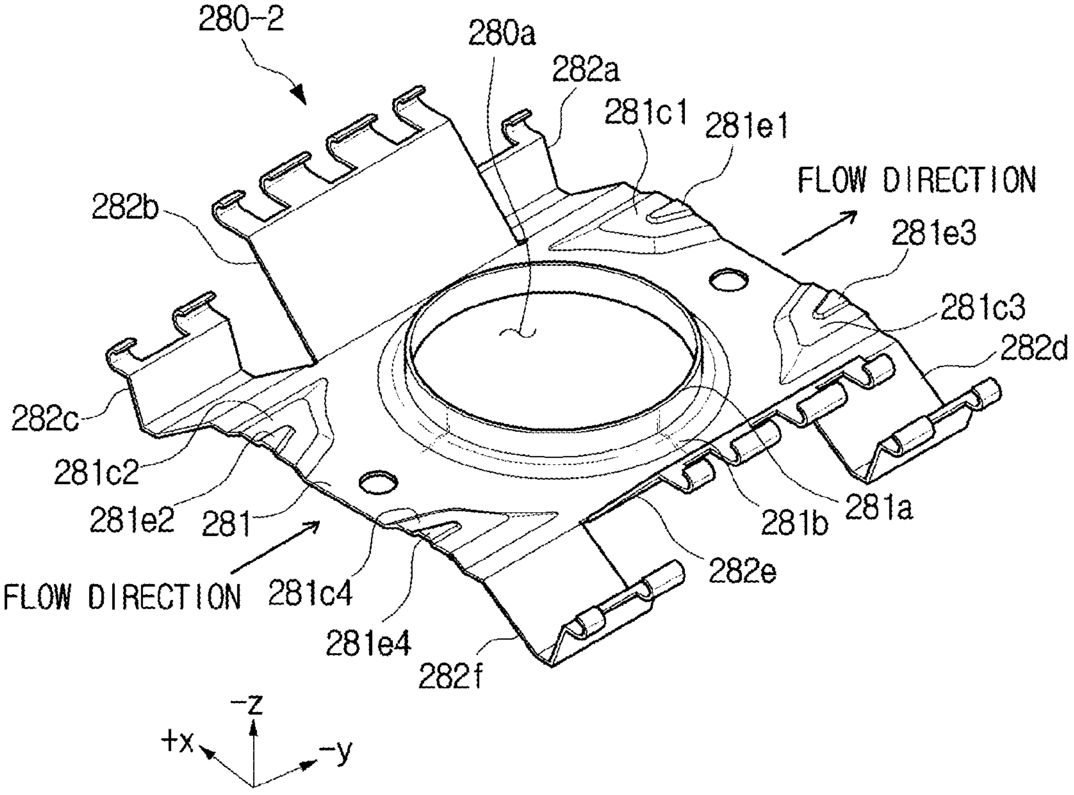
FIGS. 7A and 7B are a schematic perspective view and a cross-sectional view showing a cooling fin according to an embodiment of the present disclosure.
Figure 7B:
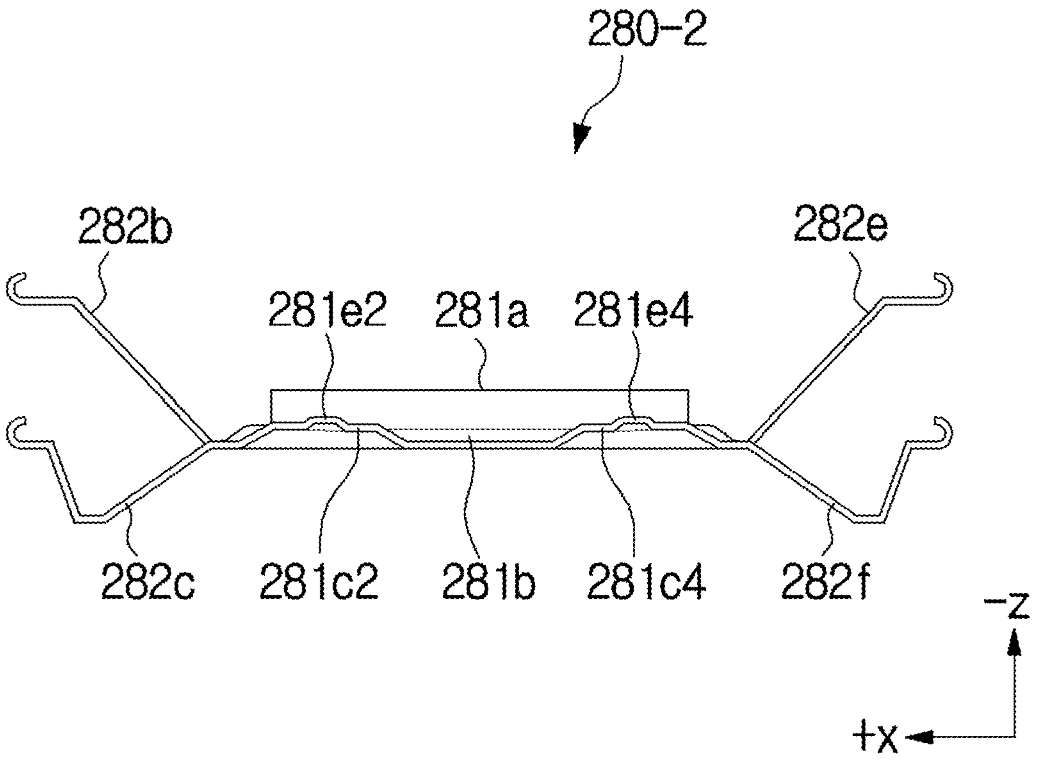

FIGS. 7A and 7B are a schematic perspective view and a cross-sectional view showing a cooling fin according to an embodiment of the present disclosure.

Referring to FIGS. 7A and 7B, a cooling fin 280-2 of FIGS. 7A and 7B is substantially similar to the cooling fin 280 of FIGS. 3A and 3B (for example, a difference therebetween is in the presence and absence of a bump 281*e*). For example, the cooling fin 280-2 of FIGS. 7A and 7B may include a dual structure second corrugated region 281*c* having the bump 281*e*.

Components 280*a*, 281*a*, 281*b*, and 282 of the cooling fin 280-2 of FIGS. 7A and 7B may be the same as the components 280*a*, 281*a*, 281*b*, and 282 of the cooling fin 280 of FIGS. 3A and 3B.

In the cooling fin 280-2 of FIGS. 7A and 7B, the bump 281*e* may be formed on the second corrugated region 281*c* of the cooling fin 280 of FIGS. 3A and 3B. A plurality of bumps 281_e_1 to 281_e_4 may be respectively formed on a plurality of second corrugated regions 281_c_1 to 281_c_4. For example, a single bump 281_e_1 may be formed on the second corrugated region 281_c_1. In the same manner, the remaining bumps 281_e_2 to 281_e_4 may be formed on the remaining second corrugated regions 281_c_2 to 281_c_4.

A shape of the bump 281_e_ may be similar to or different from the shape of the second corrugated region 281_c_. For example, the shape of the bump 281_e_ may be similar to the shape of the reduced second corrugated region 281_c_.

The bump 281_e_ may be formed only on the second corrugated regions (e.g., 281_c_1 and 281_c_3) corresponding to the downstream region of the flow.

According to an embodiment of the present disclosure, turbulence of the flow due to a flow separation may be promoted by the second corrugated region 281_c_ having the bump 281_e_ in the cooling fin 280-2. A magnitude of the turbulence of the flow caused by the second corrugated region 281_c_ having the bump 281_e_ in FIGS. 7A and 7B may be greater than a magnitude of the turbulence of the flow caused by the second corrugated region 281_c_ of FIGS. 3A and 3B.

Figure 8A:
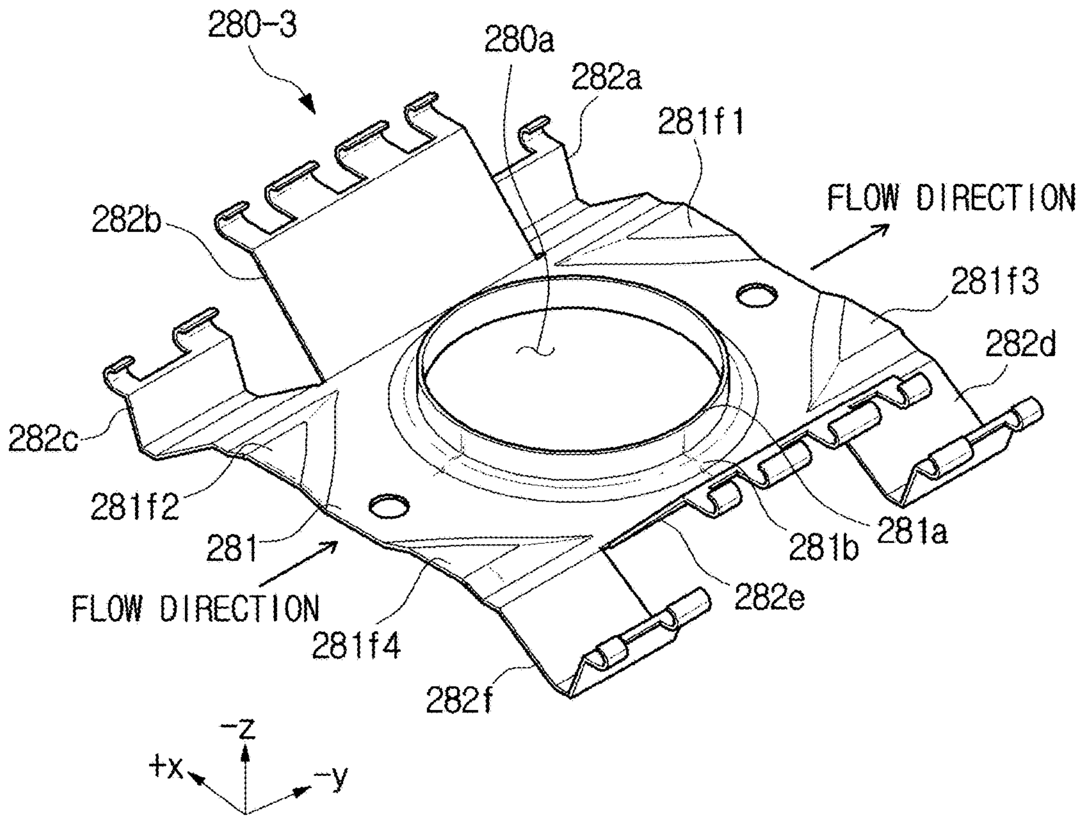
FIGS. 8A and 8B are a schematic perspective view and a cross-sectional view showing a cooling fin according to an embodiment of the present disclosure.
Figure 8B:
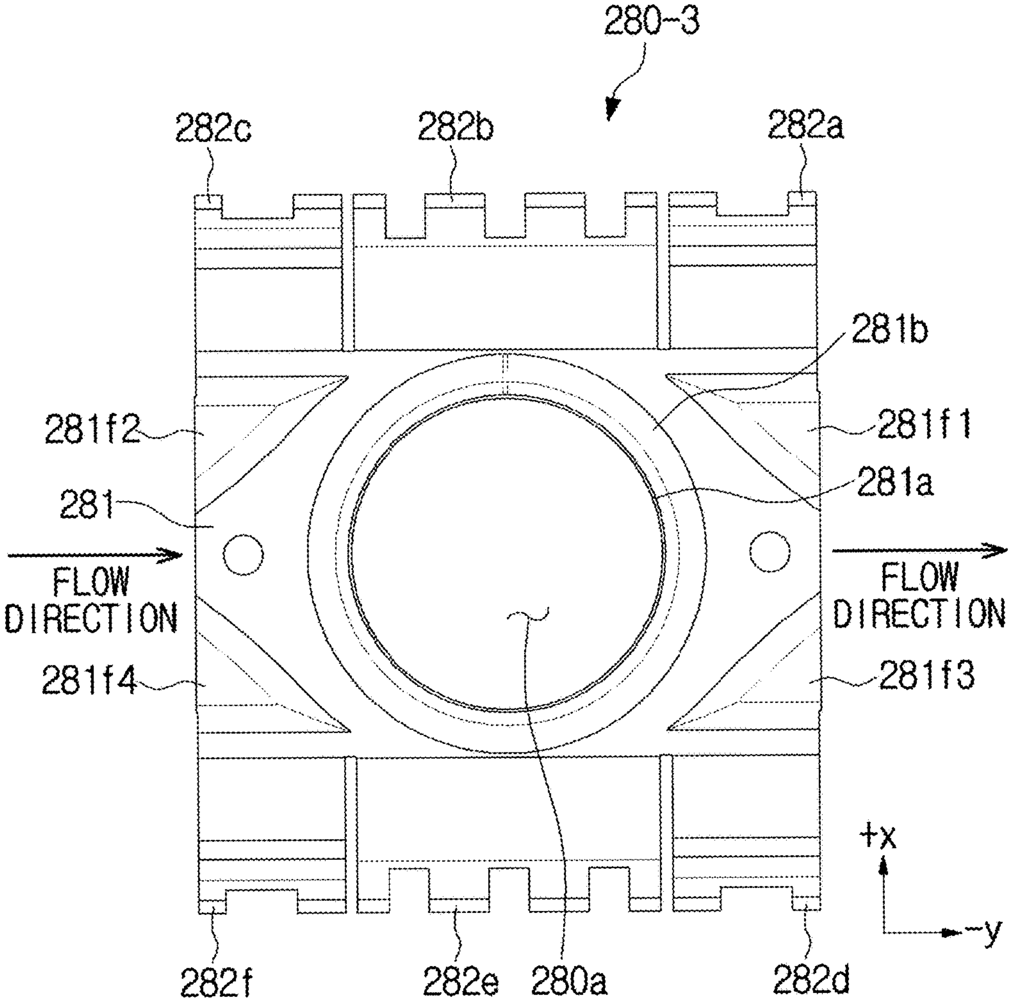

FIGS. 8A and 8B are a schematic perspective view and a cross-sectional view showing a cooling fin according to an embodiment of the present disclosure.

Referring to FIGS. 8A and 8B, a cooling fin 280-3 of FIGS. 8A and 8B is substantially similar to the cooling fin 280 of FIGS. 3A and 3B (for example, a difference therebetween is in a shape of the second corrugated region). For example, the cooling fin 280-3 of FIGS. 8A and 8B may include a second corrugated region 281_f_ having a shape similar to a truncated pyramid. For example, the cooling fin 280-3 of FIGS. 8A and 8B may include the second corrugated region 281_f_ having a shape similar to a truncated pyramid in which corners connecting vertexes of a (virtual) bottom surface thereof include at least one straight line.

Components 280_a_, 281_a_, 281_b_, and 282 of the cooling fin 280-3 of FIGS. 8A and 8B may be the same as the components 280_a_, 281_a_, 281_b_, and 282 of the cooling fin 280 of FIGS. 3A and 3B.

In the cooling fin 280-3 of FIGS. 8A and 8B, the corners connecting the vertexes of the (virtual) bottom surface in the cooling fin 280 of FIGS. 3A and 3B may be similar to the second corrugated region 281_c_, which is similar to a frustum of a pyramid such as a curved line or a parabola.

According to an embodiment of the present disclosure, turbulence of the flow due to flow separation may be promoted by the second corrugated region 281_f_ having a shape similar to a truncated pyramid in the cooling fin 280-3. A magnitude of the turbulence of the flow caused by the second corrugated region 281_f_ having a shape similar to a truncated pyramid may be greater than a magnitude of the turbulence of the flow caused by the second corrugated region 281_c_ of FIGS. 3A and 3B.

Figure 9A:
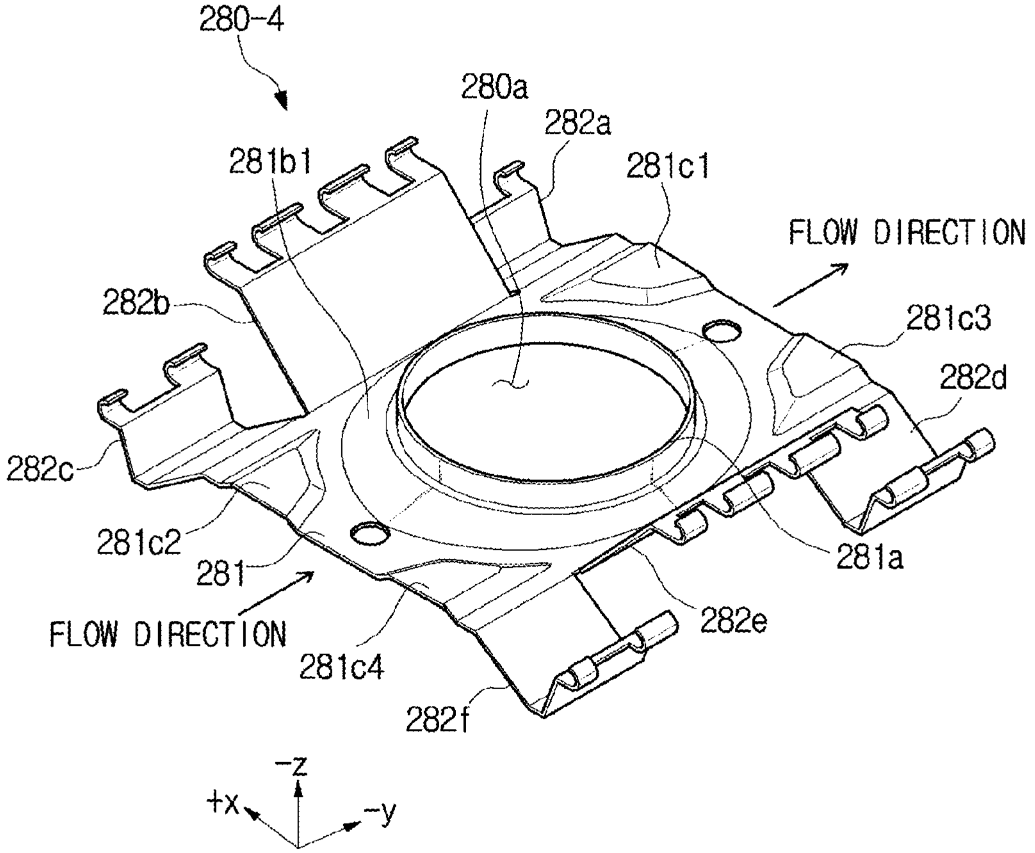
FIGS. 9A and 9B are a schematic perspective view and a cross-sectional view showing a cooling fin according to an embodiment of the present disclosure.
Figure 9B:
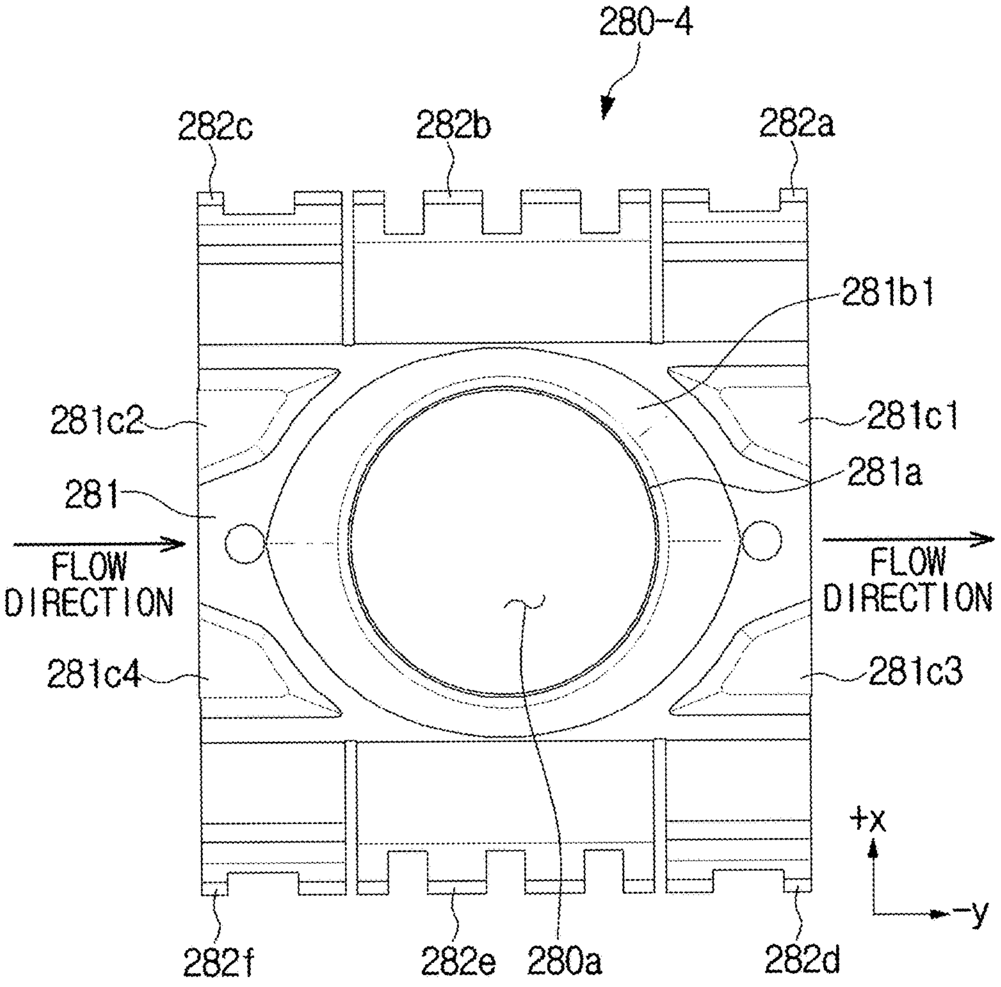

FIGS. 9A and 9B are a schematic perspective view and a cross-sectional view showing a cooling fin according to an embodiment of the present disclosure.

Referring to FIGS. 9A and 9B, a cooling fin 280-4 of FIGS. 9A and 9B is substantially similar to the cooling fin 280 of FIGS. 3A and 3B (for example, a difference therebetween is in a surface area of the first corrugated region). For example, the cooling fin 280-4 of FIGS. 9A and 9B may include a first corrugated region 281_b_1 having an increased surface area. Unlike the circular through-hole 280_a_, the first corrugated region 281_b_1 having an increased surface area may have an elliptical shape. For example, a set interval between the first corrugated region 281_b_1 having an increased surface area in the cooling fin 280-4 of FIGS. 9A and 9B and the second corrugated region 281_c_ may be smaller than the set interval between the first corrugated region 281_b_ and the second corrugated region 281_c_ of FIGS. 3A and 3B.

The first corrugated region 281_f_ may be further expanded in a downstream direction of the flow by the increased surface area in the cooling fin 280-4 of FIGS. 9A and 9B in comparison to the first corrugated region 281_b_ of the cooling fin 280 of FIGS. 3A and 3B. The first corrugated region 281_f_ may be equally applied to an upstream direction of the flow by the increased surface area.

Components 280_a_, 281_a_, and 282 of the cooling fin 280-4 of FIGS. 9A and 9B may be the same as the components 280_a_, 281_a_, and 282 of the cooling fin 280 of FIGS. 3A and 3B.

According to an embodiment of the present disclosure, flow resistance of the first corrugated region 281_f_ may be reduced by the increased surface area of the cooling fin 280-4. A magnitude of the flow resistance due to the increased surface area of the first corrugated region 281_f_ in FIGS. 9A and 9B may be smaller than a magnitude of flow resistance due to the first corrugated region 281_b_ of FIGS. 3A and 3B.

Figure 10A:
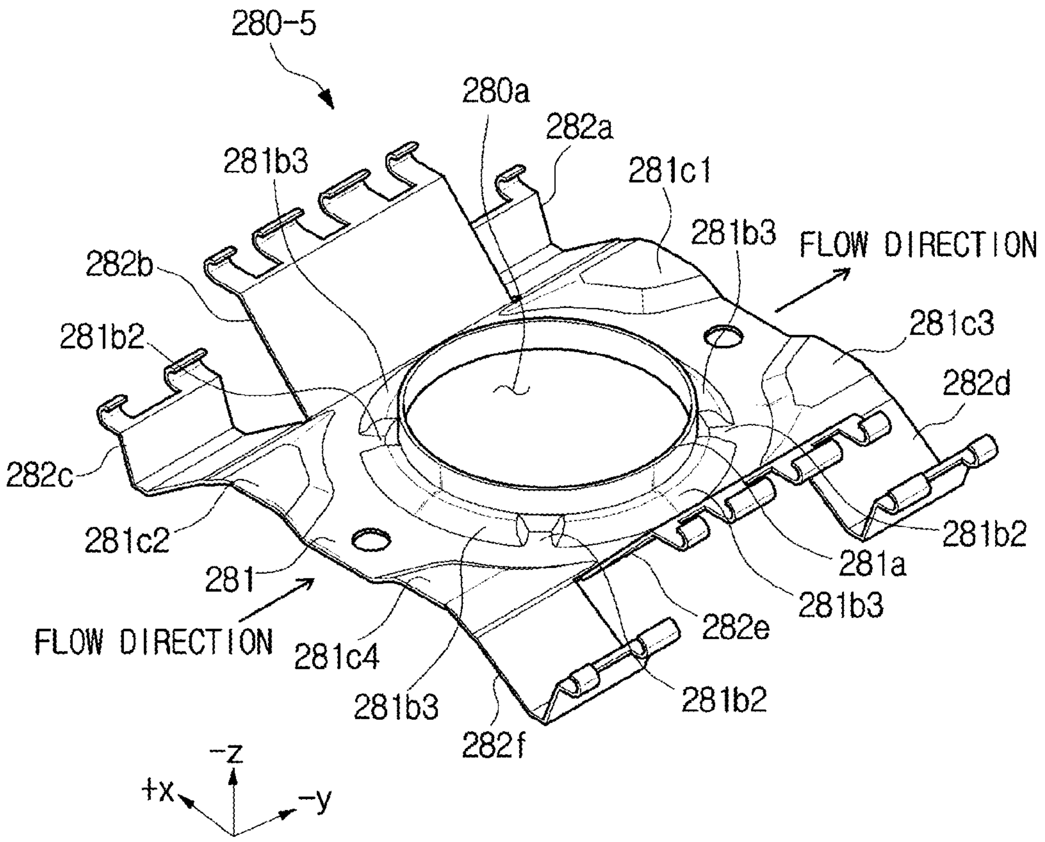
FIGS. 10A and 10B are a schematic perspective view and a cross-sectional view showing a cooling fin according to an embodiment of the present disclosure.
Figure 10B:
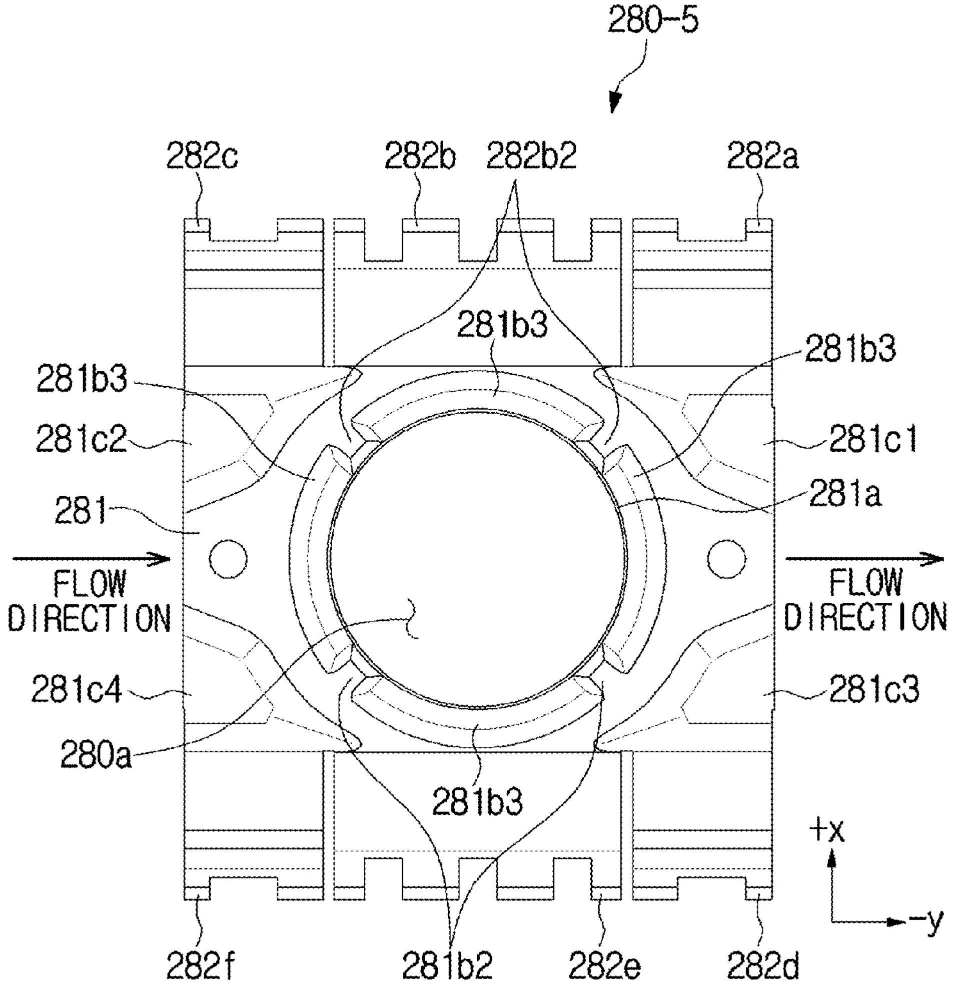

FIGS. 10A and 10B are a schematic perspective view and a cross-sectional view showing a cooling fin according to an embodiment of the present disclosure.

Referring to FIGS. 10A and 10B, a cooling fin 280-5 of FIGS. 10A and 10B is substantially similar to the cooling fin 280 of FIGS. 3A and 3B (for example, a difference therebetween is in a shape of the first corrugated region). For example, the cooling fin 280-5 of FIG. 10 may include a first corrugated region 281_b_3 having a disconnection interval 281_b_2. For example, a set interval between the first corrugated region 281_b_3 having the disconnection interval and the second corrugated region 281_c_ in the cooling fin 280-5 of FIGS. 10A and 10B may be the same as the set interval between the first corrugated region 281_b_ and the second corrugated region 281_c_. The disconnection interval 281_b_2 may extend from a virtual extension line (e.g., +z-axis direction) of the fin collar 281_a_.

Rigidity of the first corrugated region 281_b_3 having the disconnection interval 281_b_2 in the cooling fin 280-5 of FIGS. 10A and 10B may be increased. The rigidity of the first corrugated region 281_b_3 having the disconnection interval 281_b_2 in the cooling fin 280-5 of FIG. 10 may be stronger than rigidity of the first corrugated region 281_b_ of FIGS. 3A and 3B.

Components 280_a_, 281_a_, and 282 of the cooling fin 280-5 of FIG. 10 may be the same as the components 280_a_, 281_a_, and 282 of the cooling fin 280 of FIGS. 3A and 3B.

According to an embodiment, resistance to structural change may strengthened by the first corrugated region 281_b_3 having the disconnection interval 281_b_2 in the cooling fin 280-5.

Figure 11A:
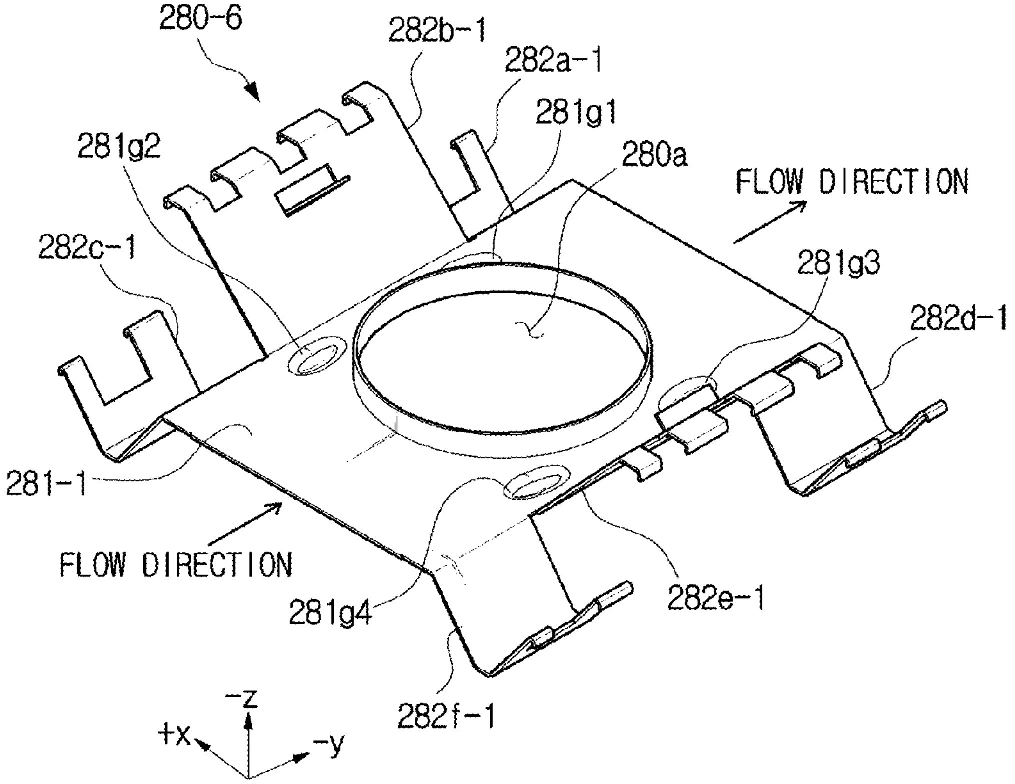
FIGS. 11A and 11B are a schematic perspective view and a cross-sectional view showing a cooling fin according to an embodiment of the present disclosure.
Figure 11B:
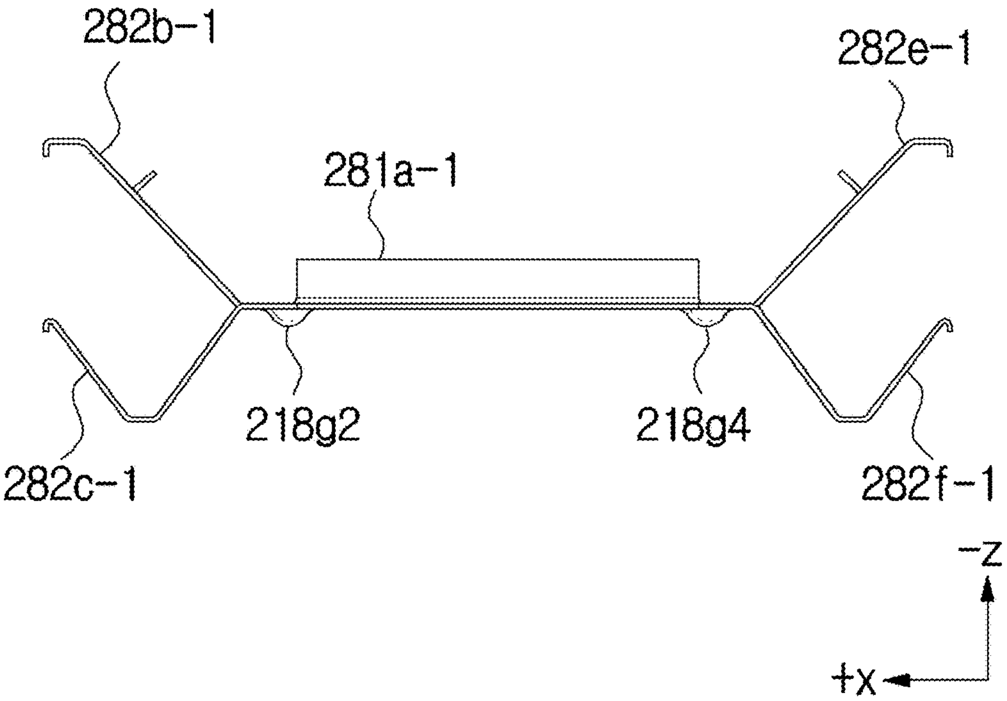

FIGS. 11A and 11B are a schematic perspective view and a cross-sectional view showing a cooling fin according to an embodiment of the present disclosure.

Figure 12A:
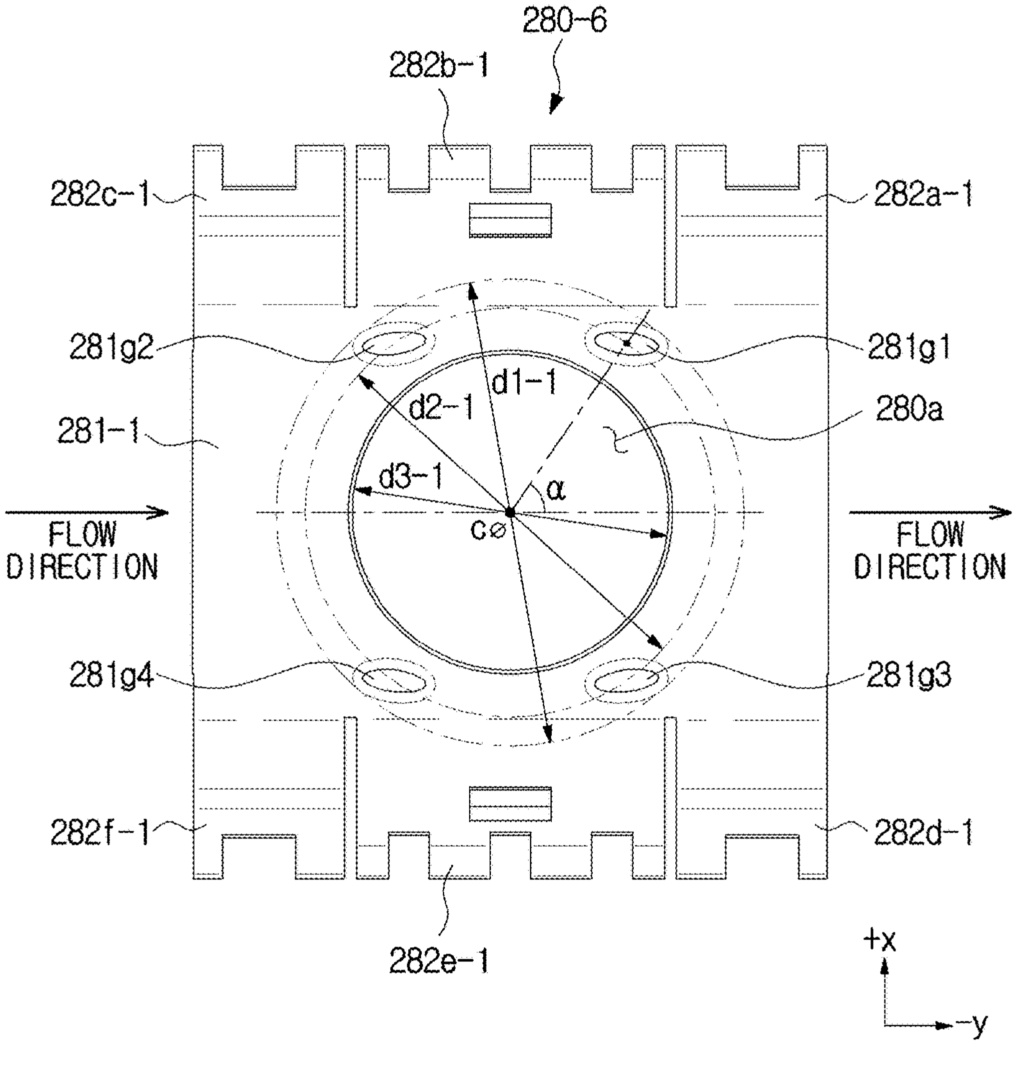
FIGS. 12A and 12B are detailed plan views showing a cooling fin according to an embodiment of the present disclosure.
Figure 12B:
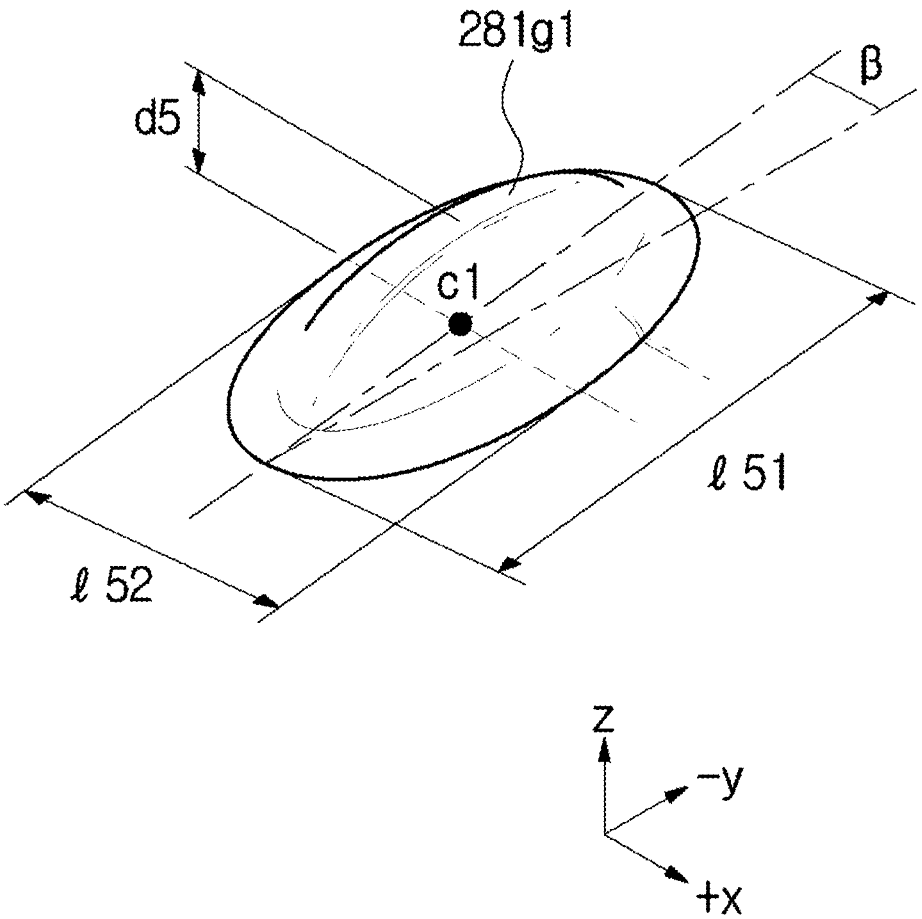

FIGS. 12A and 12B are detailed plan views showing a cooling fin according to an embodiment of the present disclosure.

Based on comparison between FIGS. 11A to 12B and FIGS. 3A to 4B, a cooling fin 280-6 that is brought into contact with an outer periphery of the anode unit 230 to cool the heated anode unit 230 has a plate shape. The cooling fin 280-6 is divided into a body 281-1 formed in a central region thereof and a plurality of multi-stage fins 282-1 (for example, 282*a*-1 to 282*f*-1) formed by both sides of the body 281-1 being bent.

A material of the cooling fin 280-6 shown in FIG. 11 may be substantially similar to the material of the cooling fin 280 shown in FIGS. 3A and 3B. In addition, a processing method of the cooling fin 280-6 shown in FIG. 11 may be substantially similar to the processing method of the cooling fin 280 shown in FIGS. 3A and 3B.

A through-hole 280*a* through which the anode unit 230 passes is formed in the central region of the body 281-1. The body 281-1 may include a fin collar 281*a*-1 that has a 1-1 diameter d3-1 (e.g., 39.8 mm, but changeable) and is bent in a first direction (e.g., in the −z-axis direction, but changeable during manufacture) along an edge of the through-hole 280*a*, and an oval-shaped corrugated region or oval-shaped groove region 281*g* that is spaced apart from the fin collar 281*a*-1 and in which a cross-section positioned in a planar portion of the body 281-1 to be concave in a second direction (e.g., in a +z-axis direction) opposite to the first direction is an oval.

A direction of the fin collar 281*a*-1 and a concave direction of the oval-shaped corrugated region 281*g* may be opposite directions. In addition, the oval-shaped corrugated region 281*g* may be seen to be convex according to a viewing direction (for example, a case in which the cooling fin is installed in the magnetron as shown in FIG. 2) thereof.

The oval-shaped corrugated region 281*g* may delay (or suppress) the occurrence of flow separation in a flow of accelerated air. The oval-shaped corrugated region 281*g* may improve an air flow characteristic behind the anode unit 230. In addition, the elliptical corrugated region 281*g* may provide constant cooling performance regardless of a direction of a flow of introduced air.

The body 281-1 may include a 1-1 corrugated region (not shown) that is substantially similar to (for example, shorter than the second diameter d1) the first corrugated region 281*b* of the body 281 of FIGS. 3A and 3B. The 1-1 corrugated region (having a 2-1 diameter) is substantially similar to the first corrugated region 281*b* of FIGS. 3A and 3B, and therefore a repeated description thereof will be omitted.

The fin collar 281*a*-1 may be brought into contact with the outer periphery of the anode unit 230. A height of the fin collar 281*a*-1 is substantially similar to the height h1 of the fin collar 281*a* of FIGS. 3A and 3B, and therefore a repeated description thereof will be omitted.

According to an embodiment of the present disclosure, a contact area of the fin collar 281*a*-1 of the cooling fin 280-6 that is brought into contact with the outer periphery of the anode unit 230 may be increased along with an increase in the height of the fin collar 281*a*-1. The contact area of the cooling fin 280-6 that is brought into contact with the outer periphery of the anode unit 230 may be increased along with the increase (for example, based on the bottom of the body 281-1) in the height of the fin collar 281*a*-1. In addition, cooling efficiency of the cooling fin 280-6 may be also increased along with the increase in the height of the fin collar 281*a*-1.

A transverse length $l_{51}$ (e.g., a long axis) of the oval-shaped corrugated region 281*g* (or the oval-shaped groove region) may be 5 mm. For example, the transverse length $l_{51}$ may be 3.5 mm or more and 6.5 mm or less. A vertical length $l_{52}$ (e.g., a short axis) of the oval-shaped corrugated region 281*g* (or the oval-shaped groove region) may be 2.5 mm. For example, the transverse length $l_{51}$ may be 1.8 mm or more and 4.3 mm or less. In addition, the transverse length $l_{51}$ of the oval-shaped corrugated region 281*g* may be 1.4 times or more and 2.8 times or less the vertical length $l_{52}$.

A center point c1 (see FIG. 12B) of the oval-shaped corrugated region 281*g* based on a transverse direction (e.g., the −y-axis direction) may be spaced apart from a center point c0 of the through-hole 280*a* at a set angle α (or a first angle) by a set distance d2-1 (or a 2-1 diameter). The set distance may be, for example, 25 mm. The set distance may be 24.5 mm or more and 25.8 mm or less.

A 2-1 diameter d2-1 from the center point c0 of the through-hole 280*a* to the center point c1 of the oval-shaped corrugated region 281*g* may be substantially similar to (for example, a difference of ±0.4 mm or less) the second diameter d1 in FIGS. 3A and 3B. In addition, the 2-1 diameter d2-1 from the center point c0 of the through-hole 280*a* to the center point c1 of the oval-shaped corrugated region 281*g* may be substantially similar to (e.g., a difference of ±0.8 mm or less) the vertical length of the body 281-1.

The 2-1 diameter d2-1 may be 1.3 times the 1-1 diameter d3-1. For example, the 2-1 diameter d2-1 may be 1.15 times or more and 1.39 times or less the 1-1 diameter d3-1.

The set angle α (the first angle) between the center point c1 (see FIG. 12B) of the oval-shaped corrugated region 281*g* and the center point c0 of the through-hole 280*a* with respect to the transverse direction (e.g., the −y-axis direction) may be 156°. For example, the set angle α may be 25° or more or 65° or less. In addition, the long axis l51 of the oval-shaped corrugated region 281*g* may be inclined at a set angle β (or a second angle) in the transverse direction (e.g., the −y-axis direction). The set angle β may be 7°. For example, the set angle β may be 5.5° or more and 9° or less.

A depth d5 of the concave oval-shaped corrugated region 281*g* may be 1 mm. For example, the depth d5 may be 0.5 mm or more and 1.9 mm or less.

The oval-shaped corrugated region 281*g* may be positioned inside a fourth diameter d1-1. A part of an edge of the oval-shaped corrugated region 281*g* may be in contact with the fourth diameter d1-1. The fourth diameter d1-1 may be 1.5 times the 1-1 diameter d3-1. For example, the fourth diameter d1-1 may be 1.4 times or more and 1.89 times or less the 1-1 diameter d3-1.

The depth d5 of the oval-shaped corrugated region 281*g* may be smaller than the height of the fin collar 281*a*-1.

According to an embodiment of the present disclosure, a plurality of oval-shaped corrugated regions 281*g* spaced apart from the through-hole 280*a* by a set distance at the set angle may guide a flow of air between the oval-shaped corrugated regions 281$g_1$ and 282$g_3$, thereby substantially increasing a heat transfer area. The cooling efficiency of the cooling fin 280-6 may be increased by the plurality of oval-shaped corrugated regions 281*g*.

According to an embodiment of the present disclosure, the plurality of oval-shaped corrugated regions 281*g* may promote turbulence of the flow.

According to an embodiment of the present disclosure, the number of the oval-shaped corrugated regions 281*g* may be an even number (e.g., 2, 6, 8, or the like) or an odd number (e.g., 1, 3, 5, 7, or the like). According to an embodiment of the present disclosure, a position (e.g., the set angle and the set distance) of the oval-shaped corrugated regions 281*g* may be changed corresponding to the number of the oval-shaped corrugated regions 281*g*.

Figure 13A:
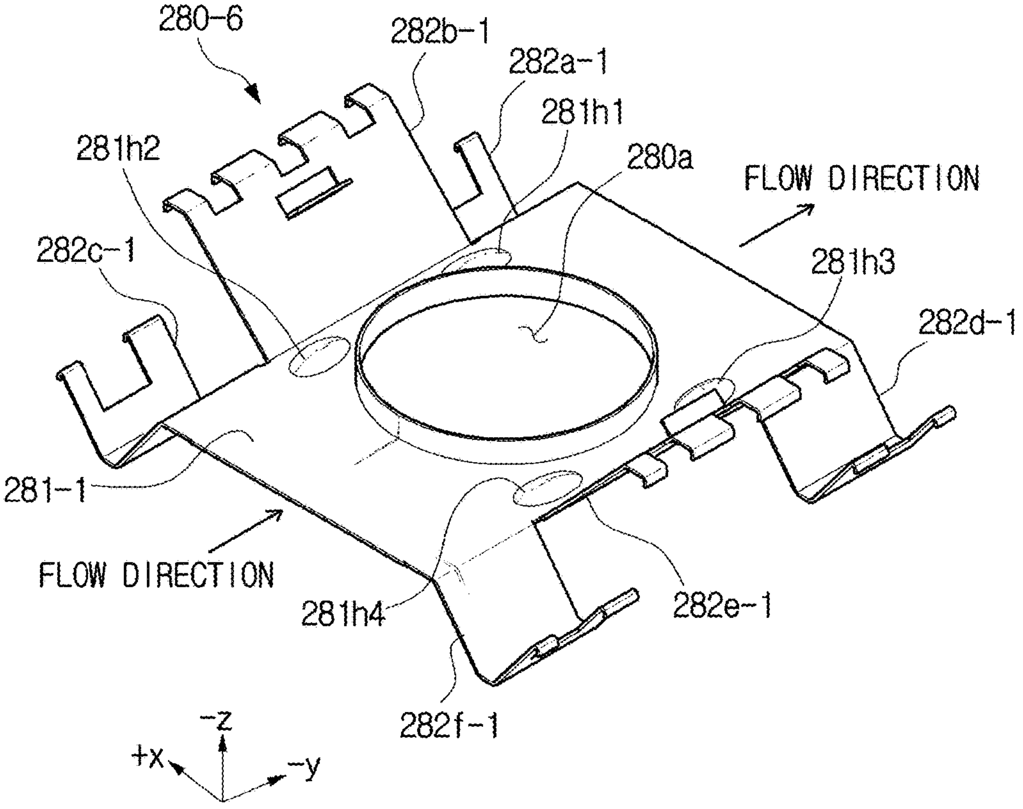
FIGS. 13A and 13B are a schematic perspective view and a cross-sectional view showing a cooling fin according to an embodiment of the present disclosure.
Figure 13B:
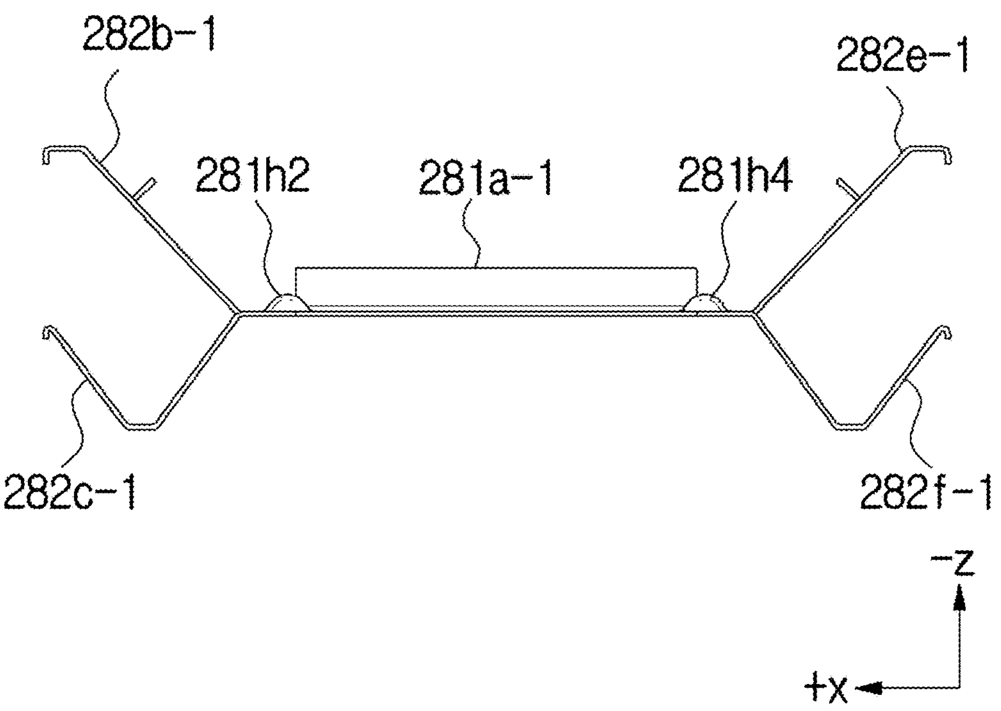

FIGS. 13A and 13B are a schematic perspective view and a cross-sectional view showing a cooling fin according to an embodiment of the present disclosure.

The body 281-1 of the cooling fin 280-6 including the through-hole 280*a* and the oval-shaped corrugated regions 281*g* in FIGS. 12A and 12B may include a through-hole 280*a* and an oval-shaped corrugated region 281*h* (or a convex groove region) in FIGS. 13A and 13B.

The convex oval-shaped corrugated region 281*h* is substantially similar to the concave oval-shaped corrugated region 281*g* of FIG. 12, and therefore a repeated description thereof will be omitted. In addition, cooling efficiency of the cooling fin 280-6 due to the convex oval-shaped corrugated region 281*h* of FIGS. 13A and 13B may be substantially similar to the cooling efficiency of the cooling fin 280-6 due to the concave oval-shaped corrugated region 281*g* of FIG. 12.

Figure 14A:
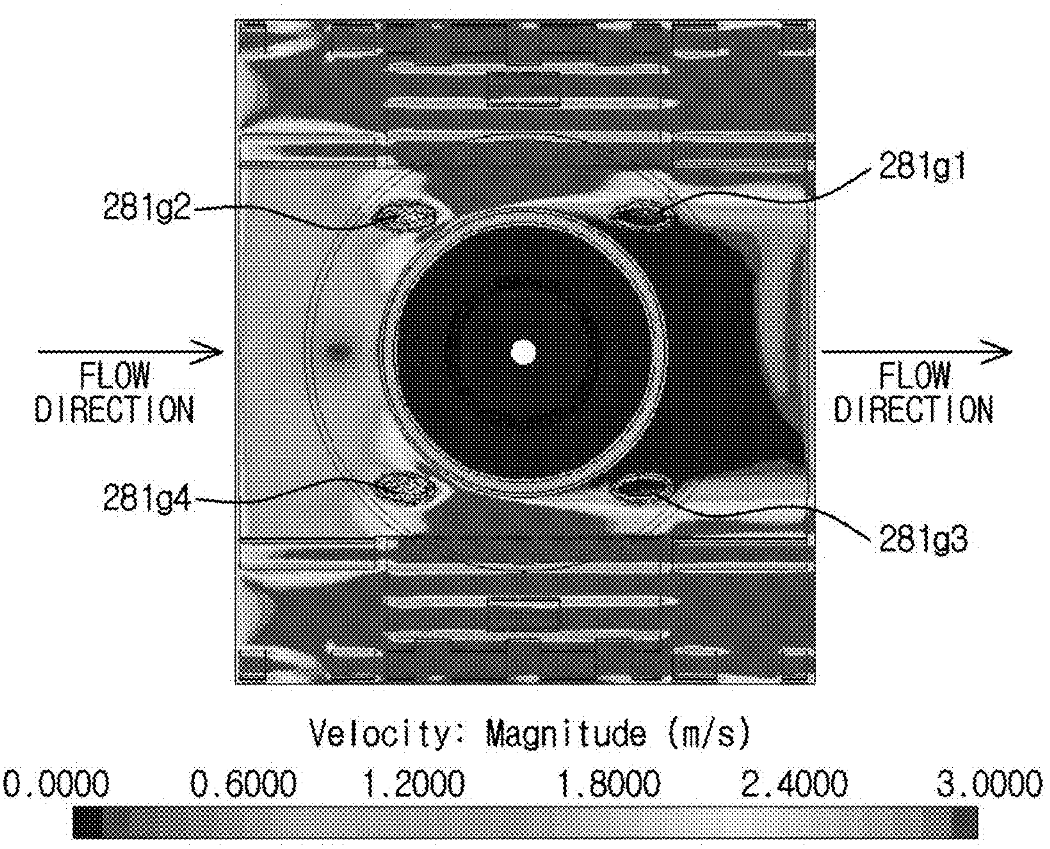
FIGS. 14A and 14B are schematic views showing a flow velocity distribution around a cooling fin according to an embodiment of the present disclosure.
Figure 14B:
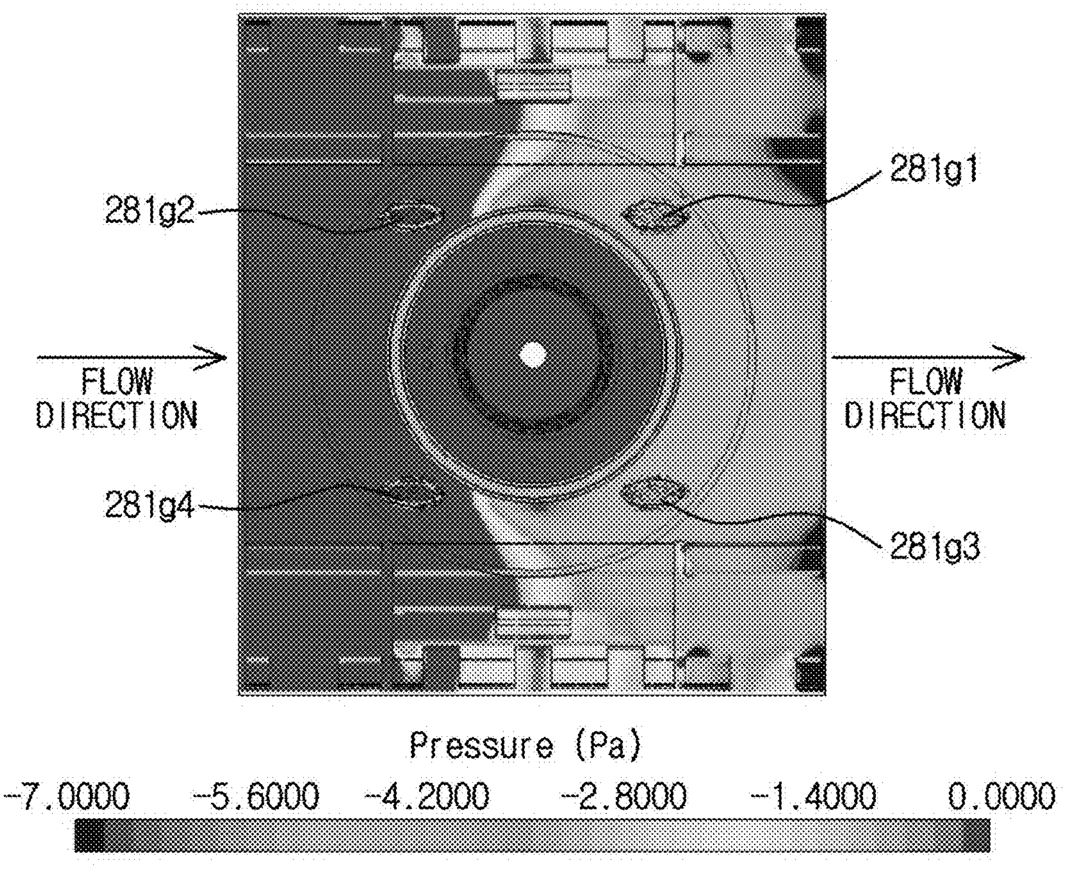

FIGS. 14A and 14B are schematic views showing a flow velocity distribution around a cooling fin according to an embodiment of the present disclosure.

Referring to FIG. 14, heat of the heated anode unit 230 may be conductive heat transferred to the cooling fin 280 so that the anode unit 230 may be naturally cooled through ambient air or forcedly cooled by rotation of the fan 140. Referring to the experimental data, a flow rate may be 0 to 3.0 m/s.

When a flow of air meets oval-shaped corrugated region 281$g_2$ and 281$g_4$ on the basis of a direction of a flow stream, a part of the flow of air may be induced to toward a dead zone. An air flow bypassed by the induction to the dead zone may be reduced. A flow separation may be delayed by the oval-shaped corrugated region 281*g*. A starting point of the flow separation may be moved to a downstream side of a flow direction. The farther downstream the starting point of the flow separation is moved by the oval-shaped corrugated region 281*g*, the more cooling efficiency of the cooling fin 280-6 may be increased.

According to an embodiment of the present disclosure, turbulence of the flow may be promoted by the oval-shaped corrugated region 281*g* of the cooling fin 280-6.

According to an embodiment, the starting point of the flow separation of the cooling fin 280 having the oval-shaped corrugated region 281*g* may be generated farther downstream in the flow direction in comparison to the starting point of the flow separation of an existing cooling fin (not shown) without the oval-shaped corrugated region 281*g*.

Referring to FIG. 14B, heat of the heated anode unit 230 may be conductive heat transferred to the cooling fin 280 so that the anode unit 230 may be naturally cooled through ambient air or forcedly cooled by rotation of the fan 140. Referring to the experimental data, pressure between the anode unit 230 and the cooling fin 280 may be between −7 Pa to 0 Pa.

The flow separation may be delayed by the oval-shaped corrugated region 281*g*. Occurrence of excessive pressure loss at a flow separation point may be prevented by the oval-shaped corrugated region 281*g*. The occurrence of excessive pressure loss behind the oval-shaped corrugated region 281*g* may be prevented by the oval-shaped corrugated region 281*g*.

The cooling efficiency of the cooling fin 280-6 may be increased by the oval-shaped corrugated region 281*g* preventing the excessive pressure loss that can occur. The cooling efficiency of the cooling fin 280-6 may be increased by the oval-shaped corrugated region 281*g* preventing the excessive pressure loss that can occur behind the oval-shaped corrugated region 281*g*.

According to an embodiment of the present disclosure, due to the oval-shaped corrugated region 281*g* increasing the cooling efficiency of the cooling fin 280, the number of the cooling fins 280-6 stacked on the magnetron 200 may be reduced.

The number (e.g., five) of the cooling fins 280-6 having the oval-shaped corrugated region 281*g* may be smaller than the number (e.g., six) of the existing cooling fins (not shown) without the oval-shaped corrugated region 281*g*.

According to an embodiment of the present disclosure, due to the oval-shaped corrugated region 281*g* increasing the cooling efficiency of the cooling fin 280-6, the thickness of the cooling fins 280-6 stacked on the magnetron 200 may be reduced.

The thickness (e.g., 0.4 mm) of the cooling fin 280-6 having the oval-shaped corrugated region 281*g* may be smaller than the thickness (e.g., 0.6 mm) of an existing cooling fin (not shown) without the oval-shaped corrugated region 281*g*.

In FIGS. 14A and 14B, the increase in the cooling efficiency of the cooling fin 280-6 having the oval-shaped corrugated region 281*g* is merely an example, and the increase may be implemented even by the cooling fin 280-6 having the convex oval-shaped corrugated region 281*h* of FIGS. 13A and 13B.

As described above, a magnetron cooling fin may have a first corrugated region for increasing a heat transfer area from the perimeter of a through-hole to the outside air and cooling a magnetron by making a flow turbulent.

A magnetron cooling fin may have one or a plurality of second corrugated regions for cooling a magnetron by making the flow turbulent by delaying flow separation.

A magnetron cooling fin may cool a magnetron through a first corrugated region and a second corrugated region.

A magnetron cooling fin may have a concave oval-shaped region for increasing the heat transfer area from the perimeter of a through-hole to the outside air and cooling a magnetron by making the flow turbulent.

A magnetron cooling fin may have a convex oval-shaped region for increasing the heat transfer area from the perimeter of a through-hole to the outside air and cooling a magnetron by making the flow turbulent.

Without being limited thereto, according to various embodiments of the present disclosure, a magnetron cooling fin may be capable of cooling a heated magnetron through one or a plurality of corrugated regions.

Although a few embodiments of the present disclosure have been shown and described, it should be appreciated by those skilled in the art that changes may be made in these embodiments without departing from the principles and spirit of the disclosure, the scope of which is defined in the claims and their equivalents.

What is claimed is:

1. A magnetron cooling fin comprising:

a body including a through-hole configured to allow an anode unit of a magnetron to pass through, a fin collar bent in a first direction at an edge of the through-hole, and a plurality of oval-shaped regions positioned around the through-hole and protruding from the body in a direction opposite to the first direction; and a plurality of fins extending from the body, wherein a distance from a center point of the through-hole to a center point of each of the plurality of oval-shaped regions is larger than a radius of the through-hole.

2. The magnetron cooling fin of claim 1, wherein the distance from the center point of the through-hole to the center point of each of the plurality of oval-shaped regions is greater than a vertical length of the body in the first direction.

3. The magnetron cooling fin of claim 1, wherein the distance from the center point of the through-hole to the center point of each of the plurality of oval-shaped regions is less than a transverse length of the body in a direction perpendicular to the first direction.

4. The magnetron cooling fin of claim 1, wherein a height of the fin collar in the first direction is greater than a depth of protrusion in the direction opposite to the first direction of each of the plurality of oval-shaped regions.

5. The magnetron cooling fin of claim 1, wherein an angle between the center point of one of the plurality of oval-shaped regions and a center axis, parallel with the body, of the body relative to the center point of the through-hole is greater than 25° and less than 65°.

6. The magnetron cooling fin of claim 1, wherein a length of a long axis, parallel with the body, of each of the plurality of oval-shaped regions is more than 1.4 times and less than 2.8 times a length of a short axis, parallel with the body, of each of the plurality of oval-shaped regions.

7. The magnetron cooling fin of claim 1, wherein a long axis of each of the plurality of oval-shaped regions is inclined with respect to a center axis, parallel with the body, of the body.

8. The magnetron cooling fin of claim 1, wherein one of the distance from the center point of the through-hole to the center point of each of the plurality of oval-shaped regions and an angle between the center point of one of the plurality of oval-shaped regions and a center axis, parallel with the body, of the body, of the body relative to the center point of the through-hole is based on a total number of the plurality of oval-shaped regions.

9. A magnetron cooling fin comprising:

a body including a through-hole configured to allow an anode unit of a magnetron to pass through, a fin collar provided at an edge of the through-hole, and a first corrugated region provided around an outer perimeter of the fin collar; and a plurality of fins extending from the body, wherein a diameter of the through-hole is less than an outer diameter of the first corrugated region.

10. The magnetron cooling fin of claim 9, wherein a height in an axial direction of the fin collar is greater than a height of the first corrugated region in the axial direction.

11. The magnetron cooling fin of claim 9, wherein the first corrugated region includes a stepped portion, and the outer diameter of the first corrugated region is greater than an outer diameter of the stepped portion.

12. The magnetron cooling fin of claim 9, wherein a shape of the first corrugated region is at least one of a circular shape and an elliptical shape.

13. The magnetron cooling fin of claim 9, wherein the body further comprises:

a plurality of second corrugated regions positioned around an outer diameter of the first corrugated region.

14. The magnetron cooling fin of claim 13, wherein the plurality of second corrugated regions guide a flow of air.

15. The magnetron cooling fin of claim 13, wherein a shape of each of the plurality of second corrugated regions is a truncated pyramid shape.

16. The magnetron cooling fin of claim 13, wherein a height, parallel to an axial direction of the through-hole, of the second corrugated region is less than a height in the axial direction of the fin collar.

17. The magnetron cooling fin of claim 13, wherein the first corrugated region and each of the plurality of second corrugated regions are spaced apart from each other.

18. The magnetron cooling fin of claim 13, further comprising:

a bump formed on an upper surface of each of the plurality of second corrugated regions.

19. A magnetron cooling fin comprising:

a body including a through-hole configured to allow an anode unit of a magnetron to pass through, a fin collar provided at an edge of the through-hole, and a plurality of first corrugated regions provided around and spaced apart from an outer perimeter of the fin collar by a predetermined interval and positioned at an edge region of the body; and a plurality of fins extending from the body, wherein the predetermined interval is less than a transverse length of each of the plurality of first corrugated regions and less than a vertical length of each of the plurality of first corrugated regions.

20. The magnetron cooling fin of claim 19, wherein the predetermined interval is less than a transverse length of a second corrugated region and less than a vertical length of the second corrugated region.

* * * * *